United States Patent [19]
Muraoka et al.

[11] Patent Number: 5,545,905
[45] Date of Patent: *Aug. 13, 1996

[54] STATIC INDUCTION SEMICONDUCTOR DEVICE WITH A STATIC INDUCTION SCHOTTKY SHORTED STRUCTURE

[75] Inventors: Kimihiro Muraoka; Naohiro Shimizu, both of Kanagawa-Ken; Takashige Tamamushi, 2-18-17, Shimoochiai, Shinjuku-ku, Tokyo, 161, all of Japan

[73] Assignees: Toyo Denki Seizo Kabushiki Kaisha; Takashige Tamamushi, both of Tokyo, Japan

[ * ] Notice: The term of this patent shall not extend beyond the expiration date of Pat. No. 5,418,376.

[21] Appl. No.: 229,328

[22] Filed: Apr. 18, 1994

[30] Foreign Application Priority Data

Apr. 19, 1993 [JP] Japan ..................... 5-115293

[51] Int. Cl.$^6$ ............ H01L 29/80; H01L 29/74; H01L 31/112; H01L 27/095
[52] U.S. Cl. .......... 257/268; 257/136; 257/138; 257/264; 257/266; 257/471
[58] Field of Search ................ 257/136, 138, 257/263, 264, 265, 266, 267, 268, 269, 471

[56] References Cited

U.S. PATENT DOCUMENTS 5,418,376  5/1995  Muraoka et al. ............... 257/136

FOREIGN PATENT DOCUMENTS

| | | | |
|---|---|---|---|
| 60-152063 | 8/1985 | Japan | 257/136 |
| 1-91474 | 4/1989 | Japan | 257/136 |
| 3-138979 | 6/1991 | Japan | 257/136 |
| 4-257266 | 9/1992 | Japan | 257/136 |

OTHER PUBLICATIONS

Maeda et al. Fast–Switching–Speed, Low–Forward–Voltage–Drop Static Induction (SI) Thyristor T.IEE Japan, vol. 115–D No. 7, '95.

Abe et al. Low–Loss, High Efficiency, Planar–Gate Normally–Off Type Static Induction (SI) Thyristor PCIM'88 Proceedings 165.

*Primary Examiner*—Steven H. Loke
*Attorney, Agent, or Firm*—McGlew and Tuttle, P.C.

[57] ABSTRACT

The present invention is to provide a Static Induction semiconductor device with a Static Induction Schottky shorted structure where the main electrode region is composed of regions of higher and lower impurity densities relative to each other, the main electrode forms an ohmic contact with the higher impurity density region and also forms a Schottky contact with a Static Induction Schottky shorted region of the lower impurity density region surrounded by tile higher impurity density region, and it is excellent in turn-off performance and easy to use, by substantially reducing tile minority carrier storage time, the fall time and the quantity of gate pull-out charges in order that charges may easily be pulled out from the cathode or source electrode as well as from the gate electrode at turn-off.

16 Claims, 28 Drawing Sheets

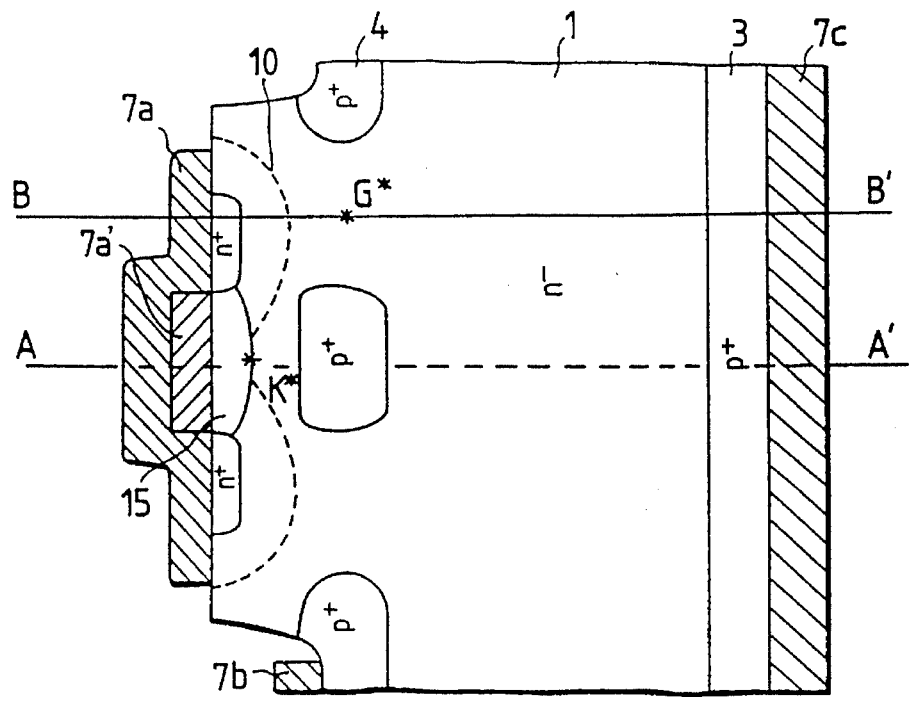
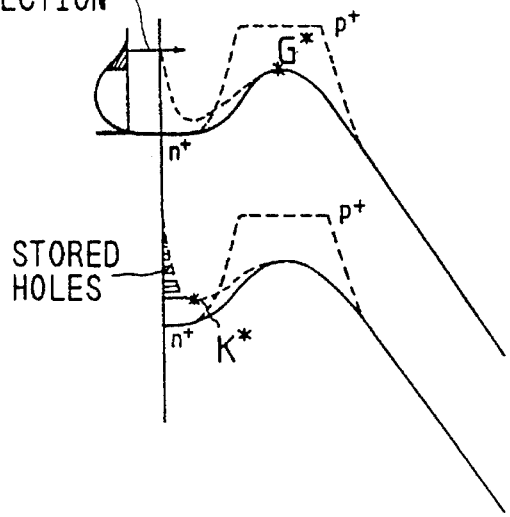
FIG.32
ELECTRON INJECTION
STORED HOLES
----- POTENTIAL DISTRIBUTION ALONG WITH A-A' LINE
——— POTENTIAL DISTRIBUTION ALONG WITH B-B' LINE STATIC INDUCTION SEMICONDUCTOR
DEVICE WITH A STATIC INDUCTION
SCHOTTKY SHORTED STRUCTURE

BACKGROUND OF THE INVENTION

1. Field of the Invention

The present invention relates generally to a Static Induction power semiconductor device with a distributed main electrode structure which provides an improvement in the device turn-off performance through substantial reduction of the minority carrier storage time, the device fall time and the quantity of pull-out charges from the gate electrode. More particularly, the invention pertains to a Static Induction Schottky shorted structure which has a Schottky shorted region formed in the distributed main electrode structure to ensure further reduction of the quantity of gate electrode pull-out charges and make possible an increase in the quantity of electron injection from the main electrode region through control of the potential barrier height of a Schottky barrier between the shorted region and the main electrode.

2. Description of the Prior Art

There have heretofore been proposed a variety of structures intended to improve switching performance of static induction (hereinafter abbreviated to SI) semiconductor devices. FIG. 35 shows in section the structure of a first prior art example that is proposed by Nishizawa and Tamamushi in Japanese Patent Public Disclosure No. 91474/89 to reduce the input capacitance between the gate and the source or between the gate and the cathode and enhance the efficiency of electron injection from the source or cathode region in an SI transistor or SI thyristor with a buried-gate structure. In FIG. 35, reference numeral 1 denotes an n-type high resistivity layer, 3 an anode region, 4 gate regions, 5 channel regions and 11 cathode regions.

In the first prior art example, a semiconductor region that serves as a cathode or source is provided only above a channel defined by buried-gates therebetween to reduce the gate-cathode or gate-source capacitance to thereby increase the device switching speed with no reduction of the channel current.

Since the semiconductor region of high impurity concentration, which serves as the cathode or source region, is provided only above the channel region defined by the buried-gate regions therebetween, the junction capacitance between the gate and cathode or source regions is smaller than in the past. Accordingly, a time constant that is defined by the product of the gate resistance and the junction capacitance is smaller than before and the gate-cathode or gate-source voltage reaches the gate region apart from a gate electrode more rapidly than before. This reduces the turn-on time and the turn-off time, and hence permits high-speed switching of the device.

A second prior art example is shown in FIG. 36, which is a sectional view of an SI thyristor disclosed by Kawamura and Morikawa in Japanese Patent Public Disclosure No. 257266/92. In FIG. 36, reference numeral 1 denotes an n⁻-type high resistivity layer, 3 p⁺-type anode regions, 4 gate regions, 6 n⁺-type short-circuit layers, 7a a cathode electrode, 7b a gate electrode, 7c an anode electrode, 11 n⁺-type cathode regions and 13 p⁺-type short-circuit regions. The structure depicted in FIG. 36 is intended to provide an SI thyristor with a shorted cathode structure which is excellent in its turn-off characteristic, current carrying capacity and breakdown voltage, by increasing the cathode area utilization factor.

The SI thyristor of the second prior art example, which has the n⁺-type cathode regions 11 and the p⁺-type short-circuit regions 13 formed in one main surface of the n⁻-type high resistivity layer (an n⁻-type base region), is characterized by a construction in which the p⁺-type gate regions 4 are buried in the n⁻-type base region 1 side by side in parallel to the said main surface thereof, the n⁺-type cathode regions 11 are each formed opposite the channel region defined by the p⁺-type gate regions therebetween and the p⁺-type short-circuit regions 13 are disposed partly opposite the p⁺-type gate regions 4.

That is, the p⁺-type gate regions 4 are provided as buried-gate regions, the p⁺-type short-circuit regions 13 are formed above the gate regions 4, and the regions defined between the short-circuit regions 13 form the n⁺-type cathode regions 11, which serve as main current paths at the cathode side. This structure provides increased device area utilization factor.

FIG. 37 is a sectional view showing, as a third prior art example, an SI thyristor disclosed by Muraoka in Japanese Patent Public Disclosure No. 152063/85. Reference numeral 1 denotes an n n⁻-type high resistivity layer, 3 second high concentration regions (p⁺-type anode regions), 4 gate regions, 7a a cathode electrode, 7b a gate electrode, 7c an anode electrode, 11 first high concentration regions (n⁺-type cathode regions), 12 a support electrode, and 14 and 14' insulating regions. With such a structure as shown in FIG. 37, the p⁺-type buried-gate regions 4 lessens the effect of a parasitic bipolar transistor formed in a region defined by the cathode and anode regions between them, thereby preventing restriking of the device by the parasitic bipolar transistor, enhancing the dv/dt capability of the device immediately after its turn-off and improving the gate loss at turn-on during high-frequency operation.

The above-mentioned third prior art example is intended to offer an SI thyristor of a novel construction that is free from the parasitic bipolar transistor effect and remarkably high in the yield rate of production.

To attain such an object, in the third prior art example, the above-mentioned first high concentration regions 11 are formed so that their junction is deep in the regions directly above the buried regions 4 and shallow in the other regions.

This structure allows the dv/dt capability just after turn-off to be held high as required, permits reduction of the gate loss at turn-on during high-frequency operation and appreciably raises the yield rate of production.

In this third prior art example, the second high concentration regions 3 may be formed so that their junction is deep in the regions directly below the buried regions 4 and shallow in the other regions. This further increases the dv/dt capability.

It is also possible to form an insulating layer between the region directly below the gate region and the anode electrode, this further enhances the above-noted effects.

In connection with the first prior art, the inventors of this application found out a phenomenon that when the device is turned on, the p⁺-type buried-gate regions 4 and the p⁺-type short-circuit regions 13 get shorted and extra holes are injected from the p⁺-type short-circuit regions 13 into the n⁻-type high resistivity region 1, increasing the quantity of charges that are extracted from the gate electrode 7b. This leads to an adverse effect that the turn-off time increases.

The SI thyristor structure of the first prior art example is intended primarily to reduce the parasitic capacitance, but since the first prior art example makes no reference to the arrangement of the cathode electrode, the flow of holes at turn-on and turn-off are unconfirmed, and it, too, makes no mention of the effect of reducing the quantity of holes extracted according to the present invention as described later on. The third prior art example also aims to lessen the effects of a parasitic bipolar transistor and a parasitic diode and makes no mention of the flow of holes at turn-on and turn-off; hence, the effect of reducing the quantity of holes that are extracted at turn-off is not found.

Moreover, the inventors of this application have found, by experiment, that in an SI device with a buried-gate structure, buried diffused layers ($p^+$-type gate regions) directly below an $n^+$-type cathode region are formed more rapidly and wider than those formed just under a region where no $n^+$-type cathode region is formed. FIG. 38 is a schematic sectional view of the SI device, for explaining the above. As shown, $p^+$-type buried-gate regions 4 just under an $n^+$-type cathode region 11 spread wider than those formed not directly under it. As is evident from FIG. 38, the distance between the gate and cathode varies according to the position of the respective buried-gate region. It is also clear that such variations in the distance between the gate and cathode is liable to cause dispersion in the breakdown voltage between the $p^+$-type gate region and the $n^+$-type cathode region in each segment forming the SI thyristor. Since the $p^+$-type gate region just under the $n^+$-type cathode region, in particular, spreads quickly toward the cathode region as well, the substantial distance between the gate and cathode decreases and the breakdown voltage between them is determined accordingly. Hence, it is necessary to control the setting of conditions for obtaining a predetermined breakdown voltage and suppress variations in the breakdown voltage in respective segment and among segments.

In the prior art examples described above, too, there is not proposed any particular cathode layout pattern aimed to suppress the dispersion in the breakdown voltage that is caused by the above-mentioned variations in the diffusion of individual buried-gate regions. Tile reason for this is that the cathode region in the prior art is usually formed uniform and homogeneous unlike a nonuniform, inhomogeneous distributed structure as proposed by the present invention.

FIG. 39 shows schematic longitudinal, cross-sectional and top views of a unit segment of the SI thyristor with a conventional buried-gate structure in which the cathode region is formed uniform and homogeneous.

As is evident from FIG. 39, the cathode electrode 7a is disposed substantially all over the $n^+$-type cathode region 11 without lying off its edge, and hence is not in touch with the n-type epitaxial layer 10. FIG. 40 shows a typical switching waveform of such a conventional SI thyristor during 1200V-100A switching conditions. Reference character $I_T$ denotes an anode current, $V_D$ an anode voltage, $I_{GP}$ a gate peak current, $I_{RG}$ a gate current and $V_{RG}$ a gate voltage.

FIGS. 41 through 44 schematically show how holes and electrons move or migrate in the unit cell structure of the SI thyristor during an on-state period $t_0$, minority carrier storage period $t_1$, a fall period $t_2$ and a tail period $t_0$ in the waveform of FIG. 40, respectively. White circles indicate holes and black circles indicate electrons.

In the on-state period $t_0$, even if the application of a forward bias between the gate and cathode is not continued, electrons inject from the cathode to the anode, whereas holes flow from the anode to the cathode via the channel or gate (FIG. 41). When a reverse bias is applied between the gate and cathode, the hole current from the anode flows into the gate and holes distributed in the channel near the gate and in the n-type epitaxial layer between the gate and cathode are also drifted by the reverse biased electric field into the gate. On the other hand, electrons keep on flowing from the cathode to the anode, but as the potential barrier height in the channel increases owing to the reverse gate, some of the electrons flow back into the cathode region. In FIG. 42, reference character "iha" is the hole current from the anode to the cathode in the minority carrier storage period $t_1$, "Qha" is the quantity of its charges, "ihb" is the hole current from the vicinity of the channel and from the n-type epitaxial layer between the gate and the cathode into the gate, "Qhb" is the quantity of its charges, "ie" the electron current flowing back into the cathode region and "Qe" is the quantity of its charges.

The quantity of charges extracted from the gate at turn-off under 1250V-300A switching conditions was Qha+Qha+ Qe=456.6 (μC). This value was obtained from a switching waveform of the conventional SI thyristor under L inductive load switching conditions described later with reference to FIG. 54.

When a depletion layer spreads between the individual gate regions and a sufficiently high potential barrier is formed in the channel, the injection of electrons from the cathode region stops and the switching waveform enters the fall period $t_2$ (FIG. 43).

FIG. 44 shows how a tail current flows in the tail period $t_3$.

It is a problem of the conventional SI thyristor that the quantity of charges to be extracted from the gate, Qha+Qhb+ Qe, is very large. An important problem, in particular, is that the quantity of charges, Qhb, is large. The large quantity of charges to be pulled out of the gate inevitably calls for a bulky gate driver and also constitutes a serious obstacle to the speeding up of the switching operation of the SI thyristor. It may sometimes cause the destruction of the device with an increase in a gate loss at turn-off under high temperature conditions.

SUMMARY OF THE INVENTION

It is an object of the present invention to provide a Static Induction semiconductor device which has a Static Induction Schottky shorted structure including a Schottky shorted region formed in a distributed main electrode structure to decrease the quantity of pull-out charges from the gate electrode at the device turn-off time and increase the quantity of electron injection from the main electrode region through control of the Schottky barrier height between the Schottky shorted region and the main electrode, thereby ensuring high turn-off switching performance and allowing ease of operation.

Another object of the present invention is to provide a Static Induction semiconductor device with a Static Induction Schottky shorted structure which suppresses variations of, the gate-source or gate cathode breakdown voltages, to provide a uniform breakdown voltage distribution and permits an electron injection from the main electrode through the Schottky junction.

Another object of the present invention is to provide a Static Induction semiconductor device with a Static Induction Schottky shorted structure which has the source or cathode laid out in a manner to minimize variations in the distance between it and the gate after their diffusion to provide therebetween a uniform breakdown voltage distribution and which permits an electron injection from the main electrode through the Schottky junction.

Another object of the present invention is to provide a Static Induction semiconductor device with a Static Induction Schottky shorted structure which enables charges to be effectively extracted from the cathode or source electrode as well as from the gate electrode at the device turn-off time and permits an electron injection from the main electrode through the Schottky junction.

Another object of the present invention is to provide a Static Induction semiconductor device which employs a distributed structure for the cathode or source region to allow ease in extracting charges from the cathode or source electrode as well as from the gate electrode at the device turn-off time and which has a Static Induction Schottky shorted structure which permits control of the Schottky barrier height by the potential of a control region.

Another object of the present invention is to provide an easy-to-use Static Induction semiconductor device with a Static Induction Schottky shorted structure which allows the use of a simple gate driver and has improved turn-off performance through effective charges to be extracted from the gate electrode at the device reduction of the quantity of turn-off time.

Still another object of the present invention is to provide a Static Induction semiconductor device with a Static Induction Schottky shorted structure which has increased gate-loss device durability at high temperatures through reduction of the quantity of gate pull-out charges and whose turn-on characteristic and on-state voltage characteristic are improved by an increase in the quantity of electron injection from the main electrode through the Schottky junction.

The Static Induction semiconductor device according to the present invention has a distributed main electrode structure in which the cathode or source electrode is formed not only over a cathode or source diffused layer but also in contact with surface of the semiconductor substrate just above channel formed therein. Furthermore, the Static Induction semiconductor device has a Static Induction Schottky shorted structure surrounded by the cathode or source diffused layer.

The Static Induction (SI) Schottky (cathode or source) shorted structure mentioned herein is a structure in which a Schottky shorted structure by the Static Induction effect is implemented in the cathode or source region. More specifically, a Schottky shorted region is formed in a low impurity density region surrounded by a high impurity density region in the distributed main electrode structure, the Schottky shorted region forming a Schottky contact with the main electrode to form a Schottky junction therebetween. The main electrode region and the Schottky shorted region are connected via the main electrode. The Schottky shorted region is surrounded by a depletion layer that spreads from the high impurity density region toward the low impurity density region. Between the Schottky shorted region and the control region there is formed a potential barrier whose height is controlled by the Static Induction effect. Consequently, carriers between the gate region acting as the control region and the Schottky shorted region are placed under the control of the potential barrier by the Static Induction effect. The provision of such a Schottky shorted region heightens the effect of directing minority carriers to the main electrode and makes possible an increase in the quantity of electron injection from the main electrode through the Schottky junction.

Furthermore, the SI Schottky shorted structure is provided in the distributed main electrode structure in which cathode or source diffused regions are distributed so as to suppress variations in the withstand voltage.

To facilitate extraction of charges from the cathode or source electrode as well as from the gate electrode at turn-off, the main electrode region is formed by regions each having an impurity density high or low relative to the other, and the Schottky shorted region is formed in the low impurity density region in contact with the cathode or source electrode. The low impurity density region serves as what is called a conduction channel for bypassing minority carriers that ought to be extracted from the gate region, and the short-circuit region serves as a so-called drain, further heightening the effect that allows easy extraction of the minority carriers from the cathode or source electrode as well. Since the Schottky barrier height is controlled by the control electrode potential owing to the Static Induction effect, the quantity of electron injection from the main electrode can be increased.

The distributed main electrode structure mentioned herein is a structure in which the impurity density in the main electrode region is distributed nonuniformly and inhomogeneously throughout it. The distributed main electrode structure also includes a structure in which high and low impurity density regions are distributed throughout the main electrode region; in this case, the both regions may be of the same conductivity type or opposite to each other. The cathode or source electrode is partly connected to the both regions. The point is that this structure has a minority carrier conduction channel formed in the main electrode region as well.

On the other hand, the Static Induction (SI) Schottky shorted structure mentioned herein is one that has a Schottky shorted region formed in the distributed main electrode structure and controls carriers flowing into the Schottky shorted region through potential barrier control by the Static Induction effect. The provision of the Schottky shorted region further enhances the minority carrier absorbing effect and increases the quantity of majority carriers (electrons) that are injected from the main electrode.

The Static Induction (SI) semiconductor device with the Static Induction (SI) Schottky shorted structure according to an aspect of the present invention, comprises a first main electrode region formed in a first main surface of a high resistivity region, a second main electrode region formed in one of said first, or a second main surface of the high resistivity region and a control region formed near the first main electrode region. The control region forms a channel region in the high resistivity region and controls the main current between the first and second main electrode regions through control of the height of a potential barrier formed in the channel region. The first main electrode region has a structure in which high and low impurity density regions are distributed. The main electrode which is formed in contact with the first main electrode region forms an ohmic contact with the high impurity density region and forming a Schottky contact with the low impurity density region. The low impurity region sandwiched between the control region and the main electrode being essentially depleted and a height of a potential barrier between the main electrode and the low impurity density region can be controlled through potential control of the control region by the Static Induction effect.

According to another aspect of the invention, the high and low impurity density regions forming the first main electrode region are identical in conductivity type with each other but are opposite to a conductivity type of said control region.

According to another aspect of the invention, the low impurity density region in the main electrode region is opposite in conductivity type to the high impurity density region but identical with the control region.

According to another aspect of the invention, the electrode that makes contact with the low impurity density region of the first main electrode region is formed of one of aluminum (Al), molybdenum (Mo), tungsten (W), platinum (Pt), titanium (Ti) or nickel (Ni), and their silicon-base alloys and silicides.

According to another aspect of the invention, the high impurity density region in the first main electrode region is split into two or more.

According to another aspect of the invention, the control region has a buried structure.

According to another aspect of the invention, the control region has a recessed structure.

According to another aspect of the invention, the control region has a substantially planar structure.

According to another aspect of the invention, in the SI semiconductor device with the SI Schottky shorted structure is an SI thyristor.

According to another aspect of the invention, in the SI semiconductor device with the SI Schottky shorted structure is an SI transistor.

BRIEF DESCRIPTION OF THE DRAWINGS

FIG. 32 is a schematic diagram for explaining the SI Schottky shorted structure and the potential distribution therein;

DESCRIPTION OF THE PREFERRED EMBODIMENT

Now, a description will be given first of the principles of operation of the SI semiconductor device with the SI Schottky shorted structure according to the present invention.

Figure 1:
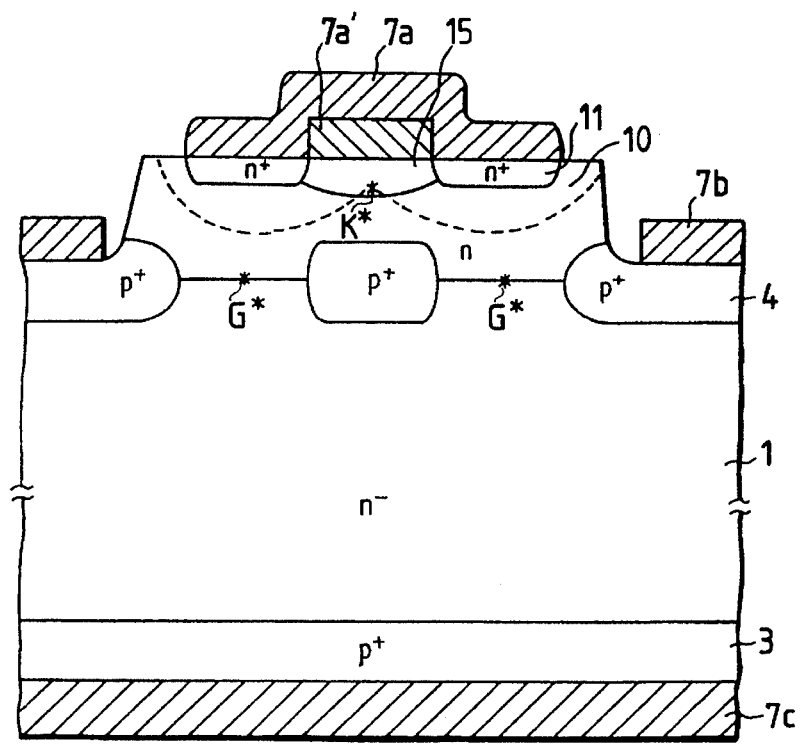
FIG. 1 is a schematic cross-sectional view showing one unit segment portion of the SI semiconductor device according to a first embodiment of the present invention.
Figure 27:
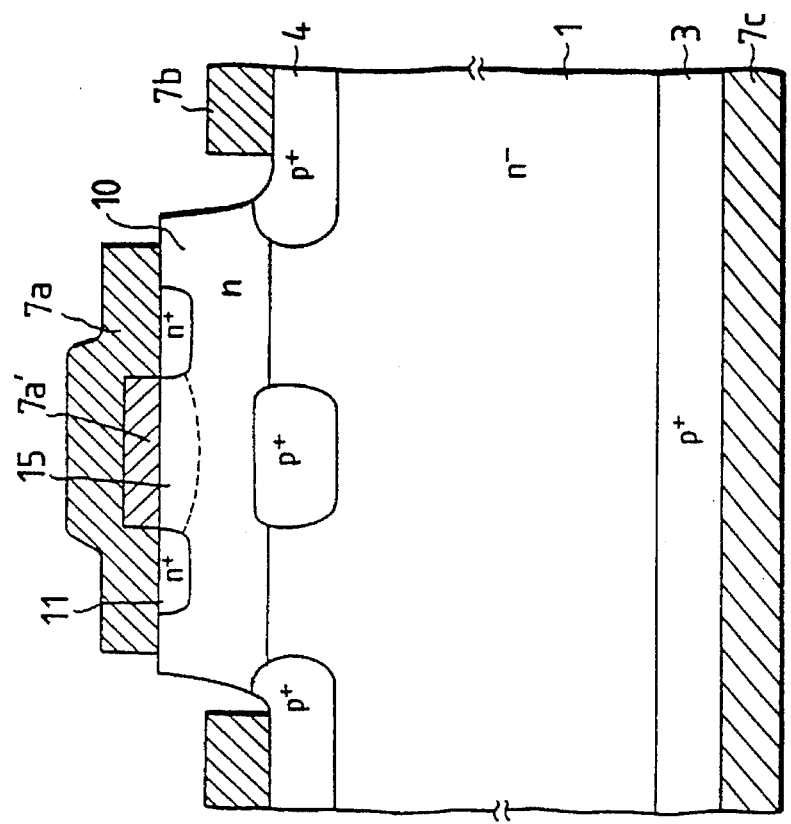
FIG. 27 is a schematic diagram for explaining the principles of operation of the present invention (a combination of the distributed cathode structure and the SI Schottky shorted structure)
Figure 33:
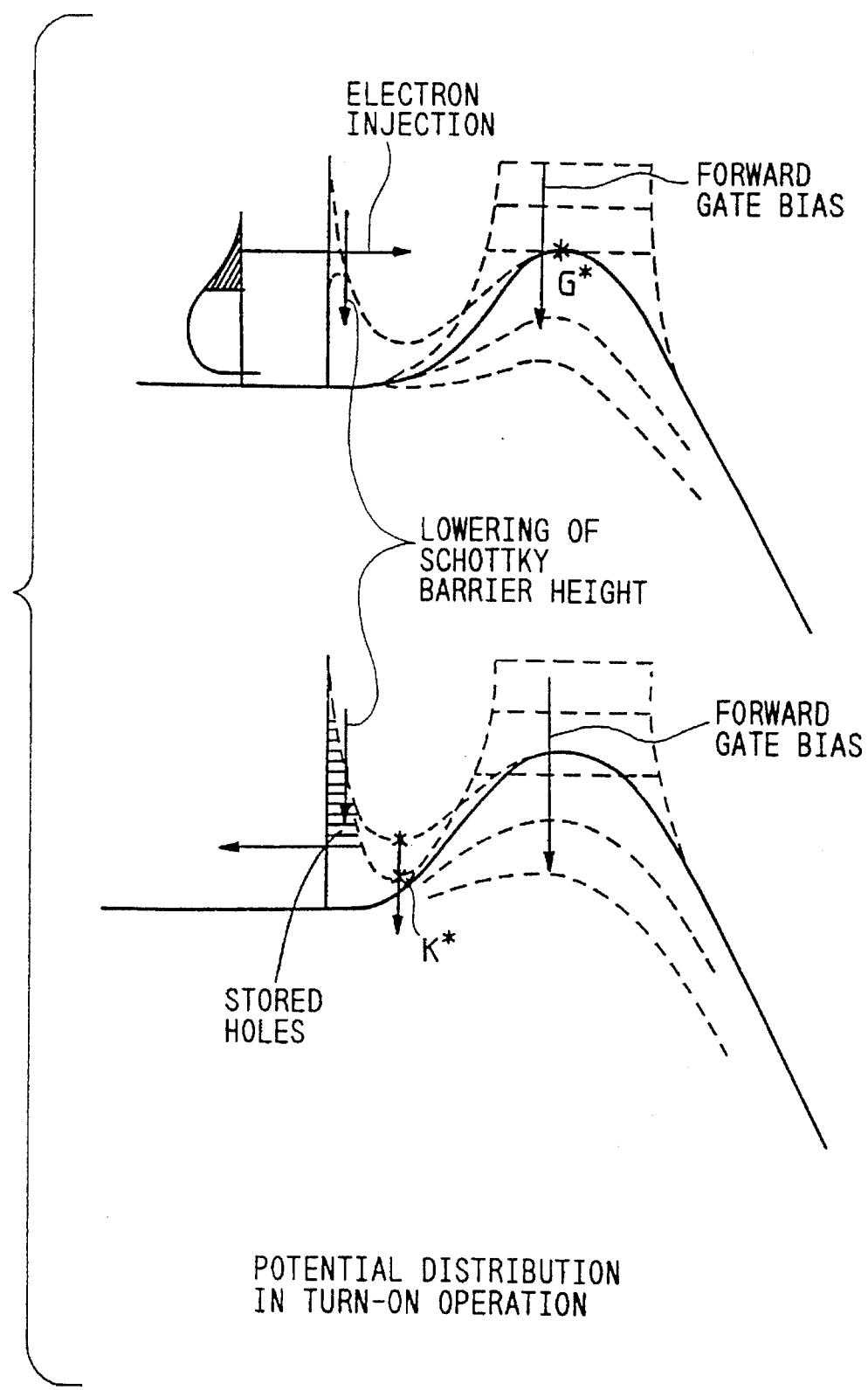
FIG. 33 is a diagram showing the potential distribution during the turn-on operation.
Figure 34:
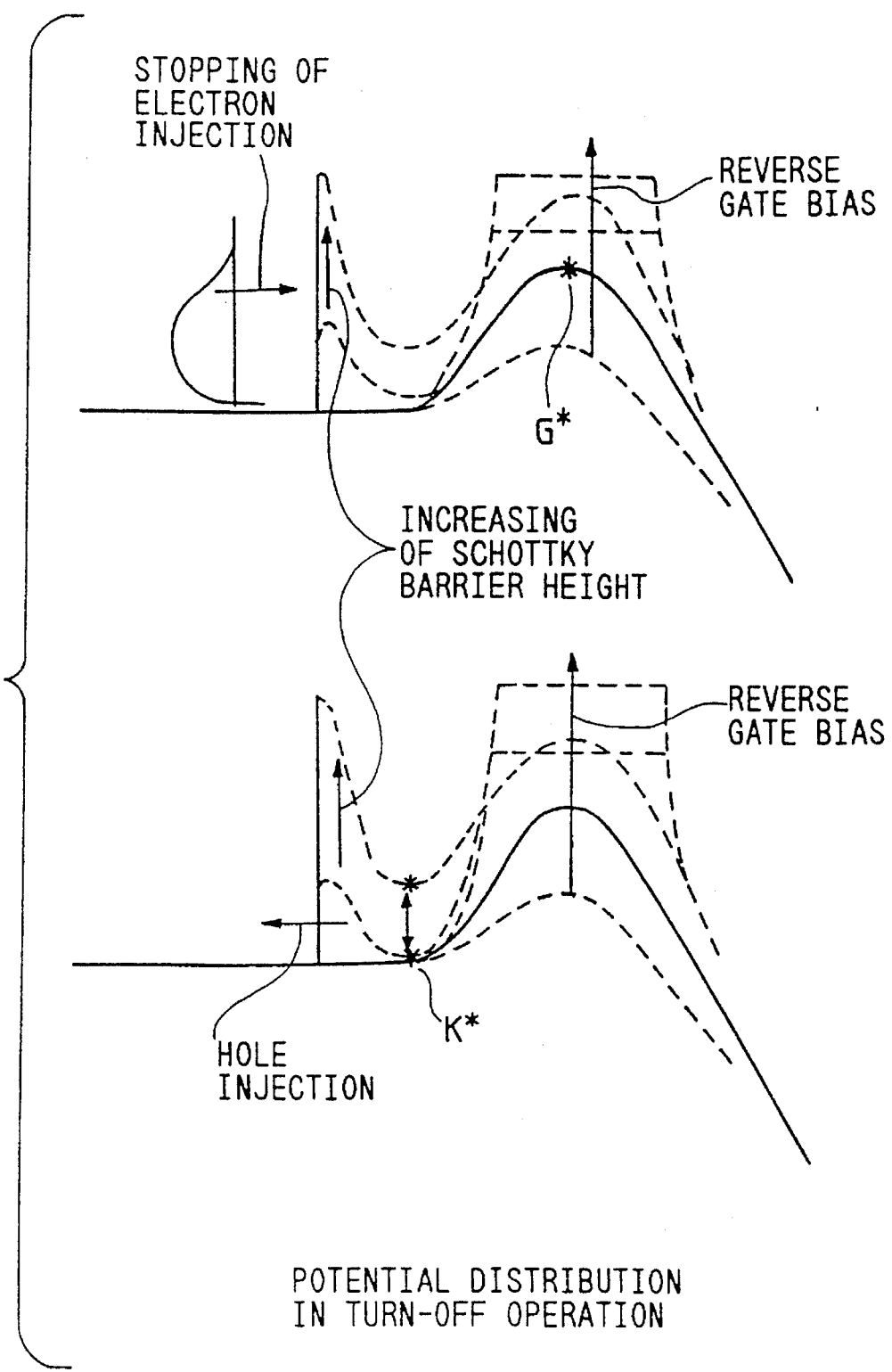
FIG. 34 is a diagram showing the potential distribution during the turn-off operation.
Figure 35:
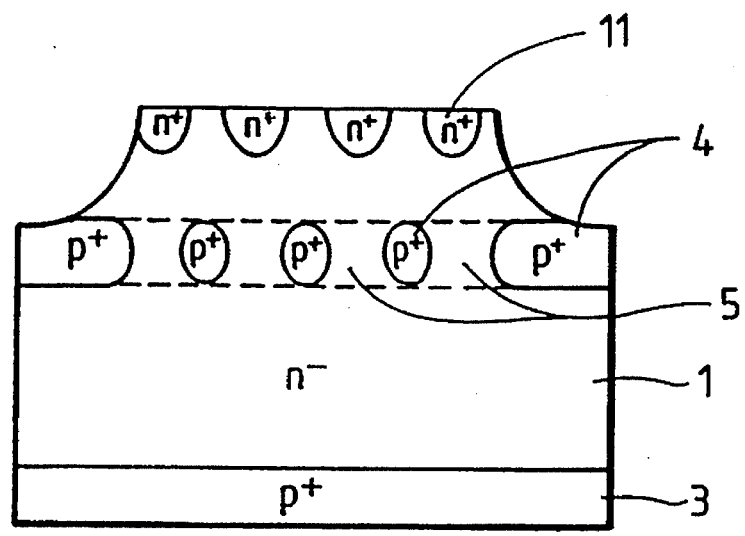
FIG. 35 is a schematic sectional view showing a conventional SI thyristor as a first prior art example.
Figure 36:
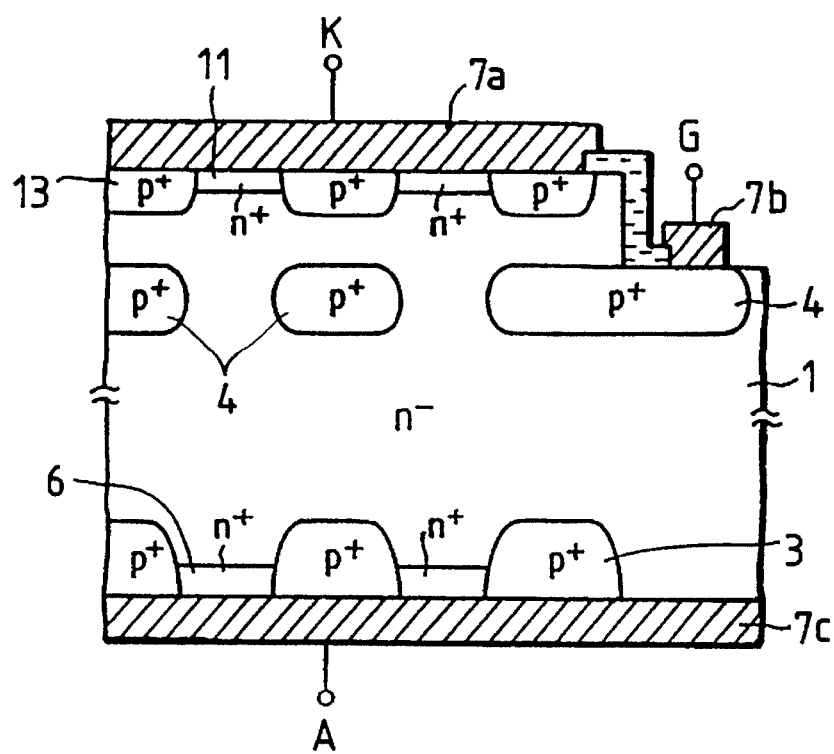
FIG. 36 is a schematic sectional view showing another conventional SI thyristor as a second prior art example.
Figure 37:
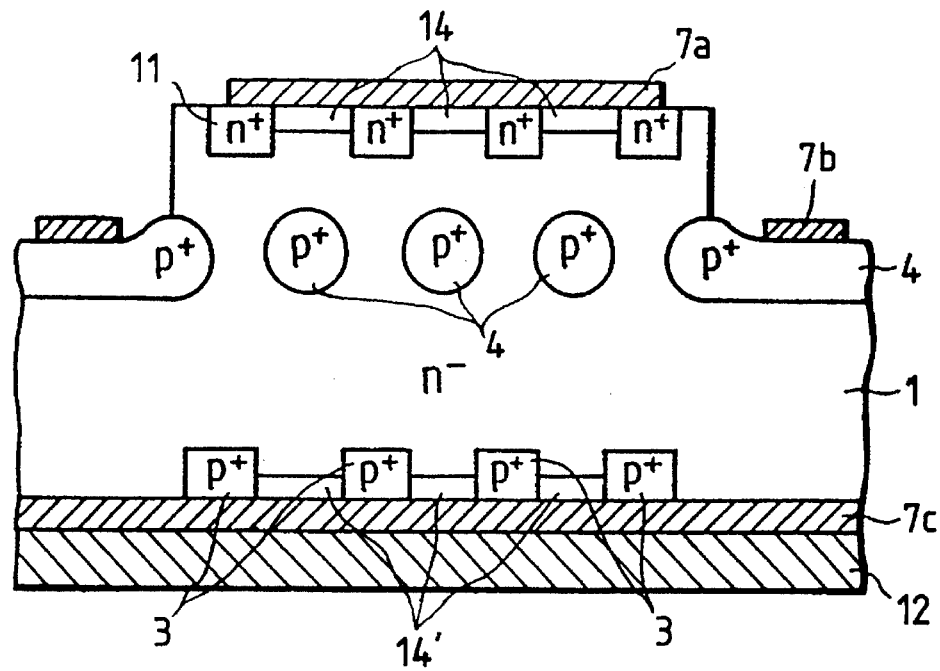
FIG. 37 is a schematic sectional view showing another conventional SI thyristor as a third prior art example.
Figure 38:
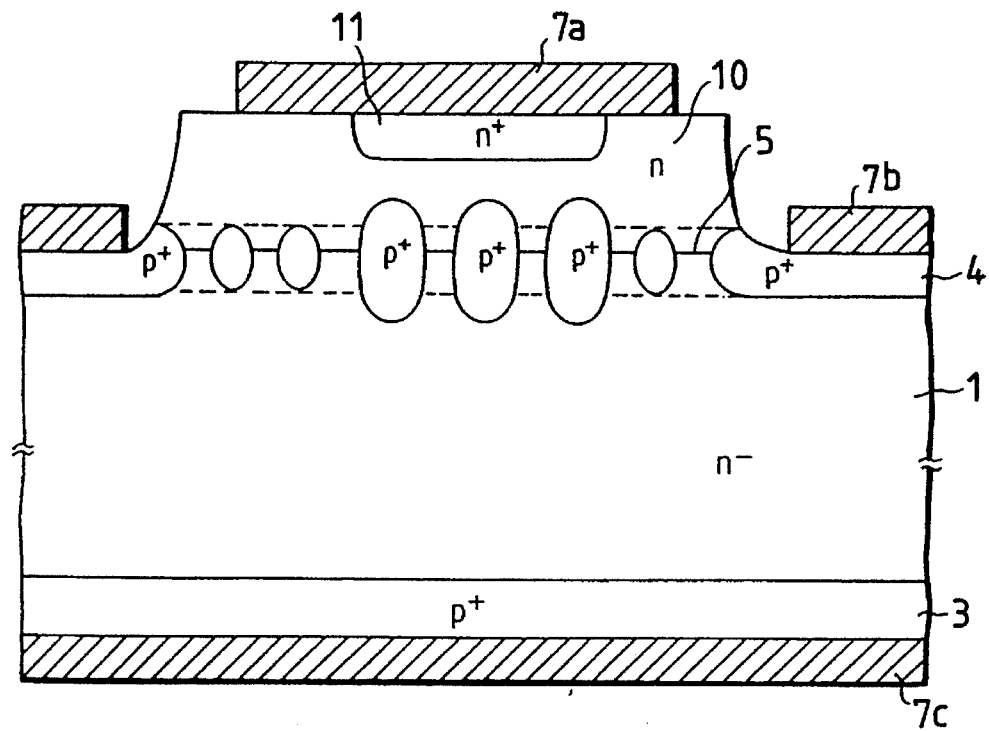
FIG. 38 is a schematic diagram showing how buried regions directly under an n$^+$-type cathode region are formed large.

FIGS. 27 through 34 are diagrams for explaining the principles of operation of the SI thyristor with the SI Schottky (cathode) shorted structure according to the present invention. FIG. 27 illustrates, by way of example, the same structure as depicted in FIG. 1, in which the cathode electrode 7a is partly in contact with the n-type region 10 as well. This is a combination of the SI Schottky cathode shorted structure and the distributed cathode structure. FIGS. 28 through 31 are diagrams for explaining the movements of carriers in the on state period $t_0$, the minority carrier storage period $t_1$, the fall period $t_2$ and the tail period $t_3$, respectively. FIGS. 32 through 34 schematically illustrate the cathode structure according to the present invention and the corresponding potential distributions, from which it will be seen that the structure of this example permits easy flowing of holes into the cathode electrode and that the Schottky barrier height is controllable through potential control of the control region by the Static Induction effect.

Figure 31:
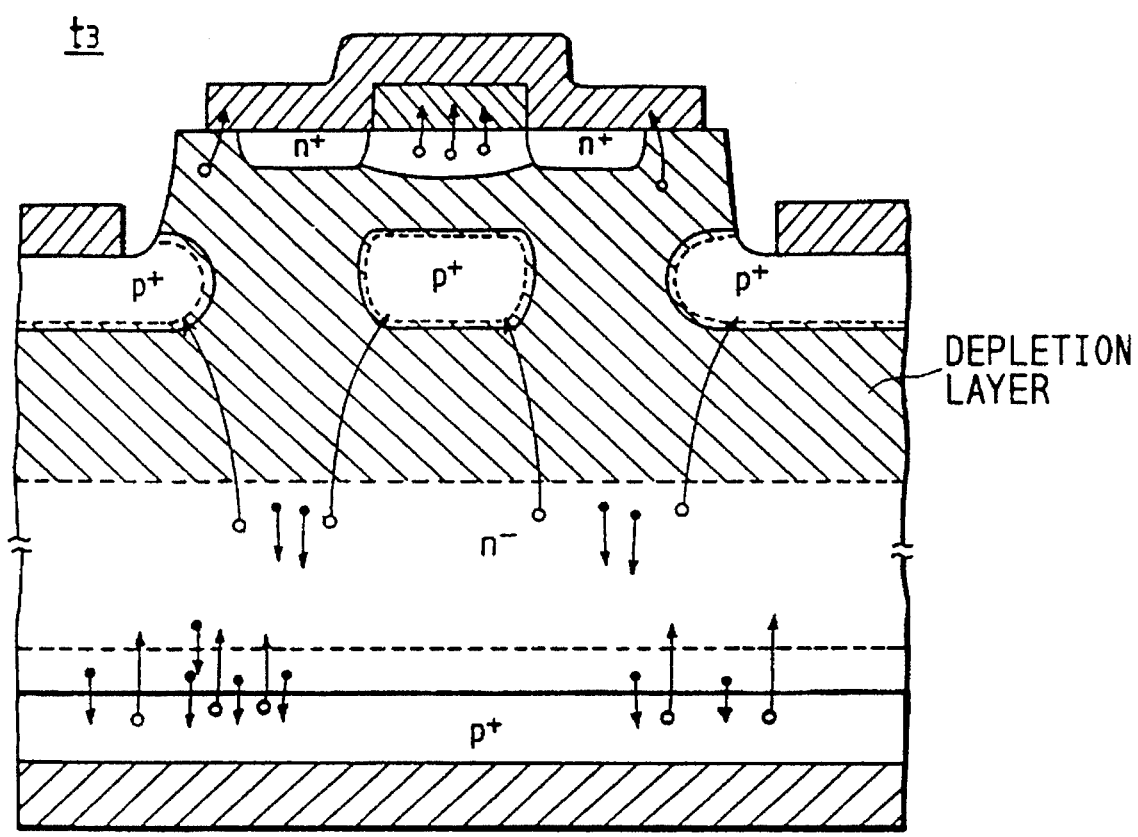
FIG. 31 is a schematic diagram showing the motion of carriers during the tail period.

FIGS. 17 through 20 respectively correspond to FIG. 31 explanatory of the principles of operation of the conventional structure referred to previously.

By virtue of the combination of the distributed cathode structure and the SI Schottky shorted structure, the device of the present invention is high-speed in operation and small in the gate peak current $I_{GP}$ at turn-off and also in the quantity of charges extracted from the gate at turn-off, as compared with the prior art device.

Moreover, since the Schottky barrier height decreases at turn-off, the quantity of majority carriers (electrons) that are injected from the cathode electrode serving as the main electrode also increases-this reduces a turn-on delay time $(t_d)$ and a turn-on rise time $(t_r)$ and lowers the on-state voltage $V_T$.

Figure 28:
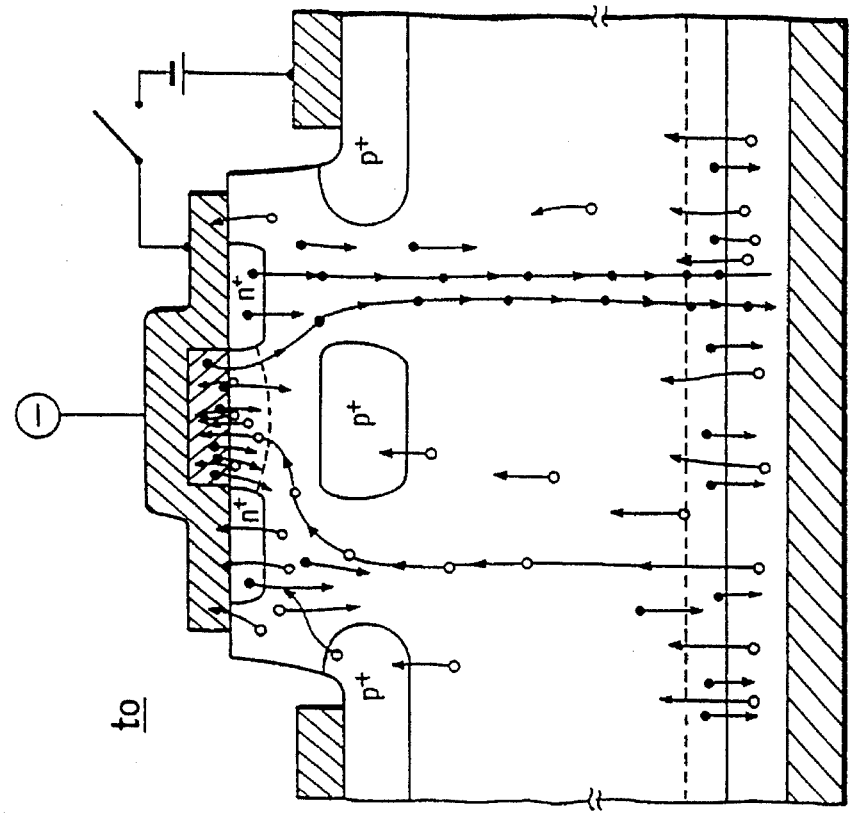
FIG. 28 is a schematic diagram showing the motion of carriers during the ON-state period.
Figure 41:
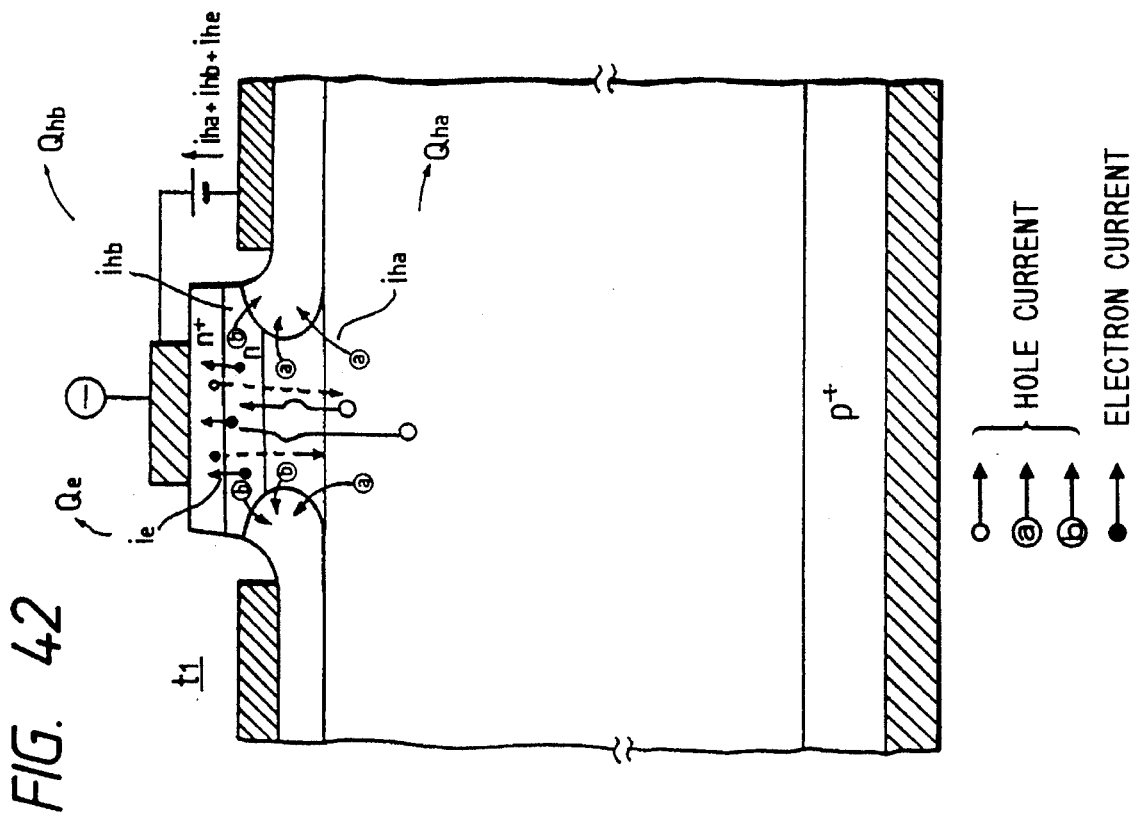
FIG. 41 is a schematic diagram showing the motion of carriers during the ON-state period.
Figure 42:
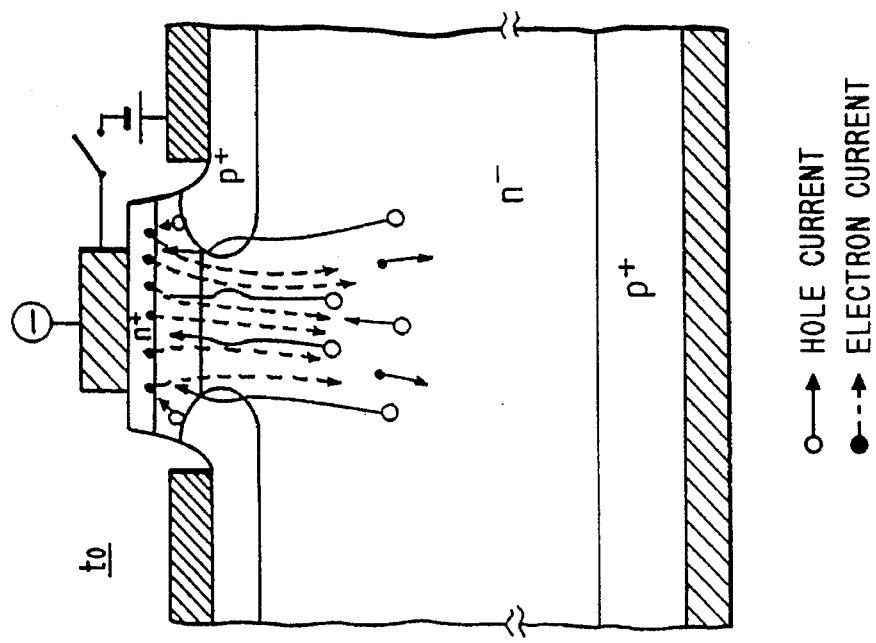
FIG. 42 is a schematic diagram showing the motion of carriers during the minority storage period.
Figure 43:
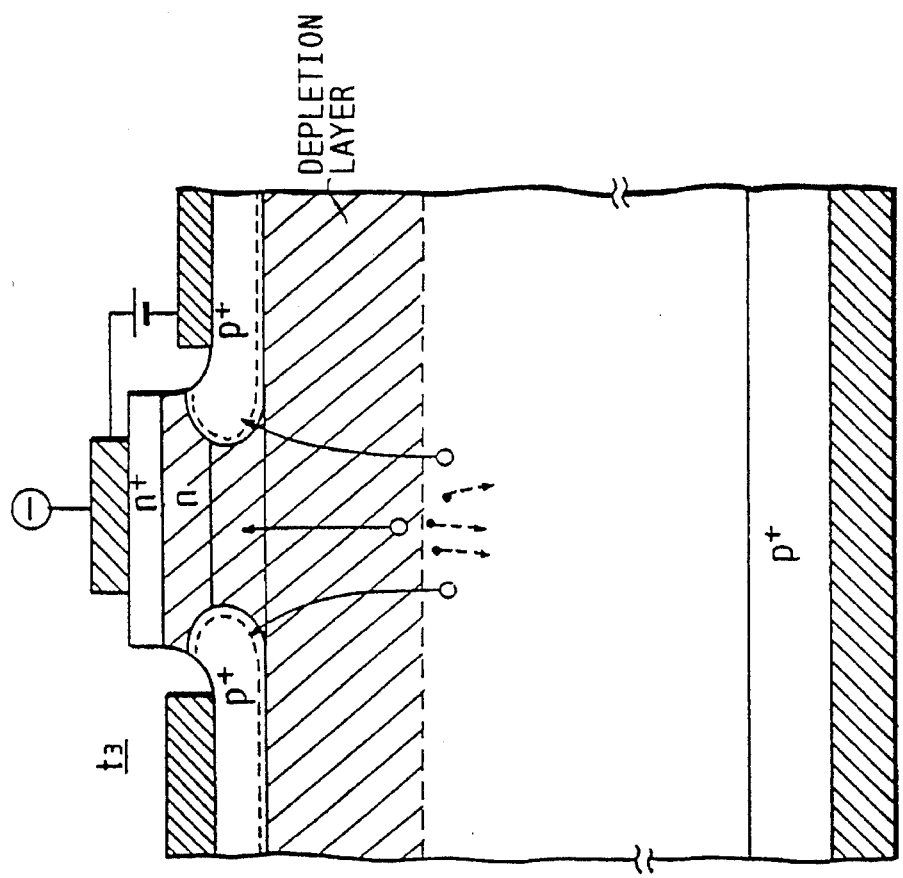
FIG. 43 is a schematic diagram showing the motion of carriers during the fall period.
Figure 44:
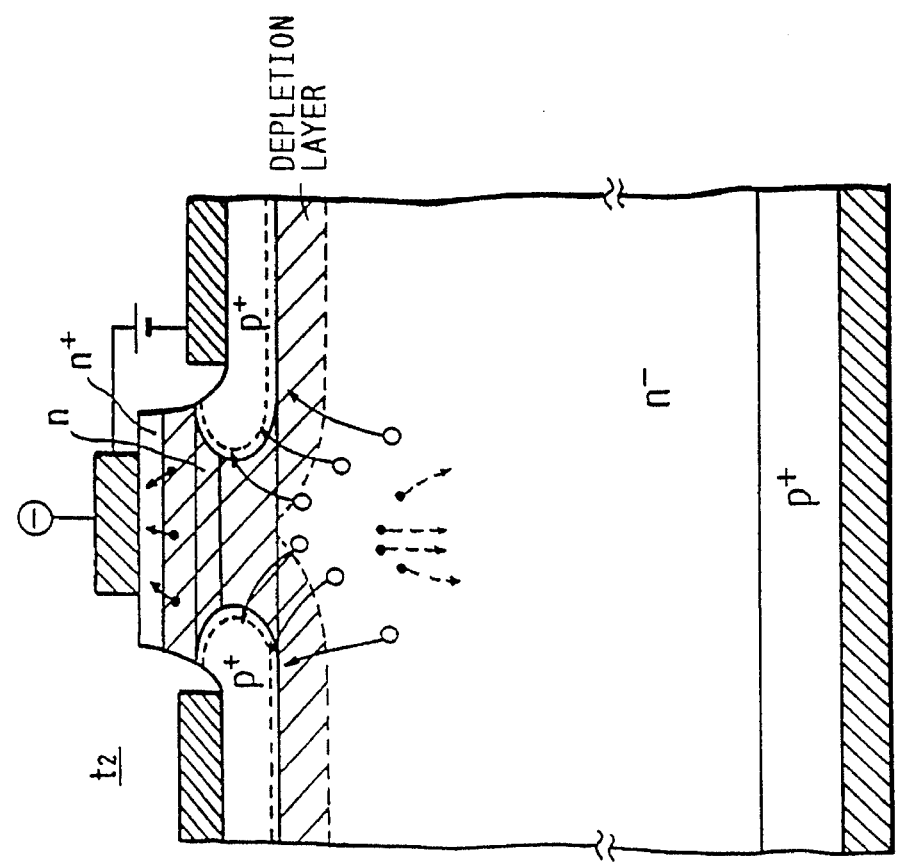
FIG. 44 is a schematic diagram showing the motion of carriers during the tail period.

A comparison of FIGS. 28 and 41 reveals the device of the present invention and the prior art device in the movement of carriers during the on-state period $t_0$. In the present invention, since the cathode electrode (7a, 7a') forms a Schottky junction with the n-type epitaxial region and is in contact with the n$^+$-type cathode region as well, the hole current in the on-state period to flows into the cathode electrode not only through the n$^+$-type cathode region but also through the Schottky junction formed between the cathode electrode and the D-type epitaxial region. At this time, minority carriers are readily stored in the Schottky junction interface, and hence the Schottky barrier height decreases accordingly. Since the Schottky barrier height is further lowered by the gate potential, the injection of majority carriers from the main electrode occurs. In the on-state period $t_0$ the hole current is likely to essentially flow into the cathode electrode through the Schottky junction which is between it and the n-type epitaxial region. At the same time, electrons are also readily injected into the cathode electrode beyond the Schottky barrier as well as through the cathode region.

Figure 29:
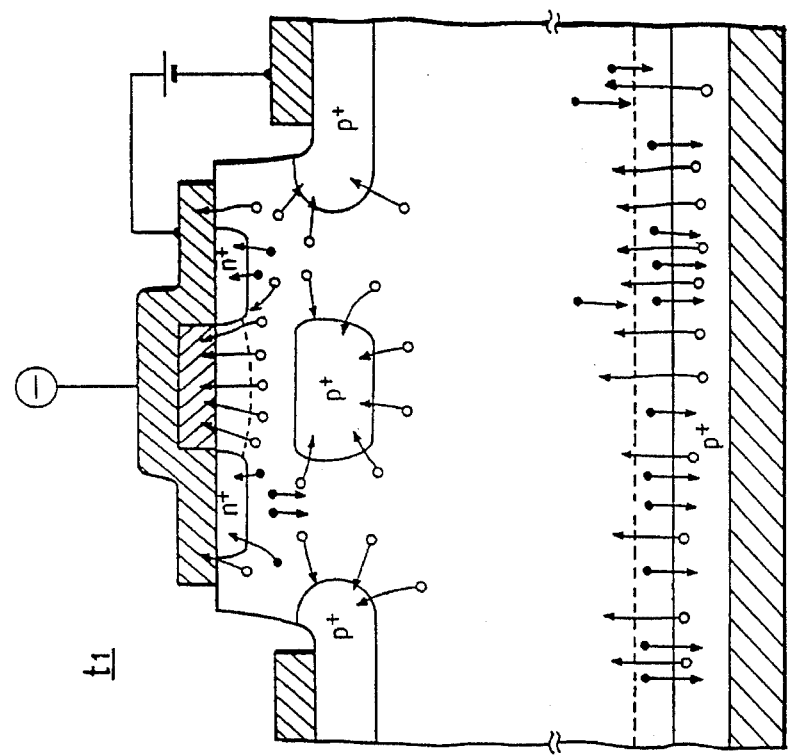
FIG. 29 is a schematic diagram showing the motion of carriers during the minority carrier storage period.

An operational feature of the device of this embodiment accounts for movements of carriers in the minority carrier storage period $t_1$ in FIG. 29. When a reverse bias is applied across the gate and cathode, the gate potential rises and the potential barrier height in the channel increases, while at the same time the Schottky barrier height lowered until then increases. As a result, the quantity of electron injection from the Schottky junction decreases and holes are pulled out of the gate but they are mostly those (Qha) of the hole current iha from the anode. The charges Qhb of the hole current ihb of holes distributed in the n-type epitaxial layer 10 near the gate region and between the gate and cathode are partly extracted from the gate but not completely, because the hole current ihb most flows into the cathode electrode 7a through the Schottky shorted region 15 and the n-type region 10. The reason for this is that the holes near the cathode readily flow into the cathode electrode 7a via the Schottky shorted region 15 in the n-type epitaxial region 10, as will be seen from the distribution profile for holes described later on. The electron current behaves in the same fashion as in the conventional device.

Thus, in the prior art the pull-out gate current is iha+ihb+ ie and the quantity of charges extracted from the gate is Qha+Qhb+Qe, whereas in the present invention they are iha−ihb+ie and Qha−Qhb+Qe, respectively. It must be noted here that the quantity of charges extracted from the gate in this structure is smaller than in the distributed main electrode structure without the p$^+$-type short-circuit region 15 and that the quantity of electron injection through the Schottky junction is highly controllable.

With the introduction of the SI Schottky shorted structure according to the present invention, the quantity of charges that are pulled out of the gate at turn-off is appreciably reduced as compared with that in the prior art.

Figure 30:
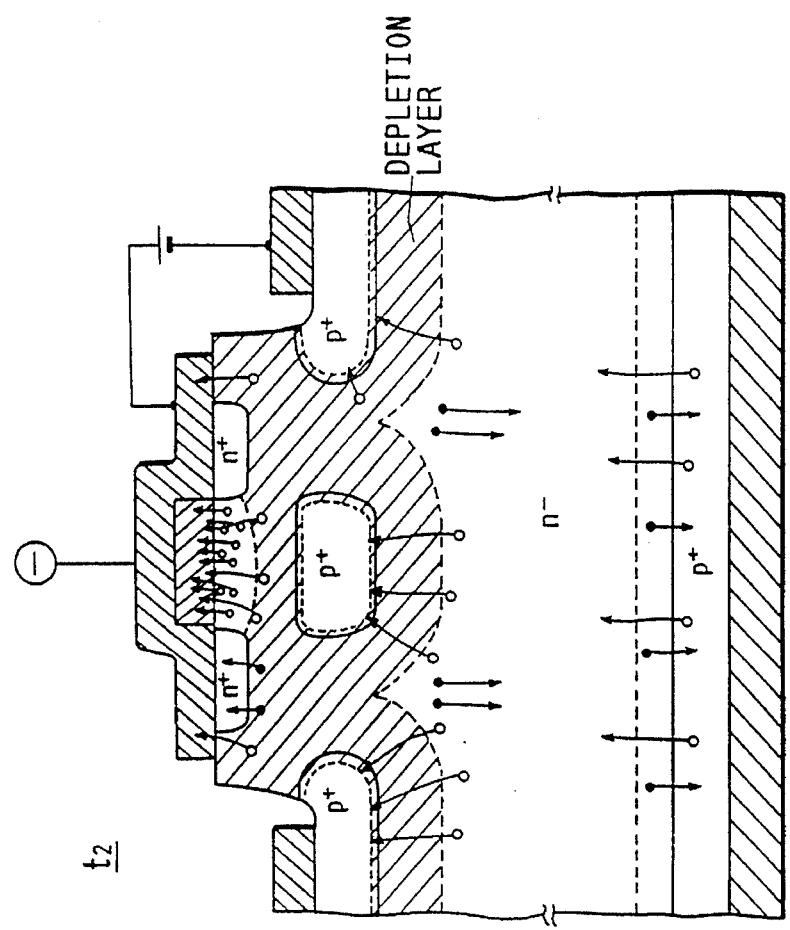
FIG. 30 is a schematic diagram showing the motion of carriers during the fall period.

Also in the fall and tail periods $t_2$ and $t_3$, holes in the n-type region 10 are readily stored in the SI Schottky shorted region 15, and hence flow therethrough into the cathode electrode (7a, 7a') as shown in FIGS. 30 and 31.

FIGS. 32 through 34 each schematically illustrate the SI cathode shorted structure of the SI thyristor according to the present invention and the corresponding potential distributions in the cathode and its vicinity. The broken and full lines indicate potential distributions along the lines A—A' and B—B', respectively. In front of the Schottky cathode shorted region 15 there is an intrinsic cathode point K * where the potential barrier against holes is highest, and in the channel region between adjacent gate regions 4 there is an intrinsic gate point G *. The currents of holes and electrons are controlled accordingly. Moreover, a Schottky barrier is formed at Schottky junction; as holes are stored in the Schottky shorted region 15, the Schottky barrier lowers, allowing electrons to be injected from the Schottky cathode region 7a'. FIG. 33 shows how the Schottky barrier gradually lowers with a forward gate bias by the static induction effect. As the Schottky barrier lowers, the quantity of electron injection increases and the holes in the Schottky shorted region 15 are more likely to flow into the Schottky cathode electrode 7a'. FIG. 34 shows the state of ON-to-OFF translation by the application of a reverse gate bias. As the reverse gate bias rises, the potential at the intrinsic gate point G * increases and the Schottky barrier height also increases by the static induction effect, stopping the electron injection. At this time, the holes also flow into the cathode side. As is evident from the potential distribution profiles, holes are readily stored in the Schottky interface between the cathode electrode 7a and the n-type epitaxial layer 10; consequently, the hole current ihb mostly tends to flow into the cathode electrode 7a through the Schottky junction during the turn-off period. Thus, the quantity of charges that are pulled out of the gate at turn-off is reduced accordingly.

In the region where the SI Schottky shorted structure is formed, holes are positively stored, by which the Schottky barrier height is reduced. At the same time, the Schottky barrier height is reduced. At the same time, the Schottky barrier height decreases by the static induction effect of the gate as well. As the result of this, the electron injection from the cathode electrode 7a' occurs. For efficient control of the potential barrier at the Schottky junction, it is desirable that the gate regions 4 each be disposed bear the Schottky junction. That is, the n-type region 10 sandwiched between the SI Schottky shorted region 15 and each gate region 4 is virtually depleted and the height of the Schottky barrier is controlled in terms of static induction according to potential variations of the gate region 4. The electrons are injected through the n⁺-type cathode region 11 as well as the Schottky shorted region 15. Thus, the SI semiconductor device of the present invention allows the electron injection through the SI Schottky shorted region 15 as well, and hence permits a corresponding extra conduction of electrons during the on-state period. This shortens the turn-off delay time and the turn-on rise time and also reduces the on-state voltage. On the other hand, holes are pulled out of the gate region 4 and the SI Schottky shorted region 15 in the turn-off period. The holes are also readily pulled out of the region where the cathode electrode (7a, 7a') are formed in direct contact with the n-type region 10. The more the holes are absorbed into the cathode electrode, the more the Schottky barrier height increases and the more readily the electron injection is inhibited.

Embodiment 1

FIG. 1 schematically illustrates, in cross-section, one segment portion of the SI semiconductor device according to a first embodiment of the present invention. Reference numeral 1 denotes an n⁻-type high resistivity layer, 3 a p⁺-type anode region, 4 p⁺-type gate regions, 7a a cathode electrode, 7a' a Schottky cathode electrode, 10 an n-type epitaxial layer, 11 an n⁺-type cathode region, and 15 a SI Schottky shorted region. Reference character K * denotes an intrinsic cathode point, where the potential barrier against holes that are stored in the SI Schottky shorted region 15 is highest. Reference character G * denotes an intrinsic gate point, where the potential barrier against electrons in the channel portion defined between adjacent gate regions 4 is highest. While in this embodiment the cathode electrode 7a and the Schottky cathode 7a' are shown to be formed separately, they may be formed as one region. The Schottky cathode electrode 7a' is formed of a material suitable for forming a relatively high Schottky barrier between it and the n-type region 10, such as molybdenum (Mo), tungsten (W), titanium (Ti), platinum (Pt) or similar high refractory metal, or their silicon-base alloys, or silicides. The cathode electrode 7a is formed of a metal which makes ohmic contact with the n⁺-type cathode region 11, such as aluminum (Al).

As is evident from FIG. 1, the SI Schottky shorted region 15 is the interface region between the Schottky cathode electrode 7a' and the n- type region 10 and is as thin as thousands of angstroms or less. The SI Schottky shorted region 15 may preferably be sandwiched between the n⁺-type cathode regions 11 and surrounded by a depletion layer spreading over the junction between the n⁺-type cathode region 11 and the n-type region 10. The structure of this embodiment facilitates storing holes in the Schottky shorted region 15 and triggering the injection of electrons from the Schottky cathode electrode 7a beyond the SI Schottky barrier by the static induction effect of the gate potential. The holes stored in the Schottky shorted region 15 easily flow into the Schottky cathode electrode 7a'. Consequently, the quantity of charges that are pulled out of the gate during the turn-off period is reduced, whereas the quantity of electrons that are injected during the on-state period is increased.

While in the FIG. 1 embodiment the SI Schottky shorted region 15 is shown to be formed only above the buried p⁺-type region 4, it may be formed above the channel region. It is also possible, of course, to reduce the spacing between the n⁺-type cathode regions 11 to change the area of the SI Schottky shorted region 15. The ratio between the area Sk of the cathode region 11 and the area Sc of the shorted region 15 is represented as a short circuit ratio $$\left[ = \frac{Sc}{Sk + Sc} \right],$$

and it has been experimentally ascertained to be desirable that the value be about 30% or lower.

In this embodiment the cathode electrode 7a and the Schottky cathode electrode 7a' are shown to be formed of different materials, but they may be formed of the same material.

Embodiment 2

Figure 2:
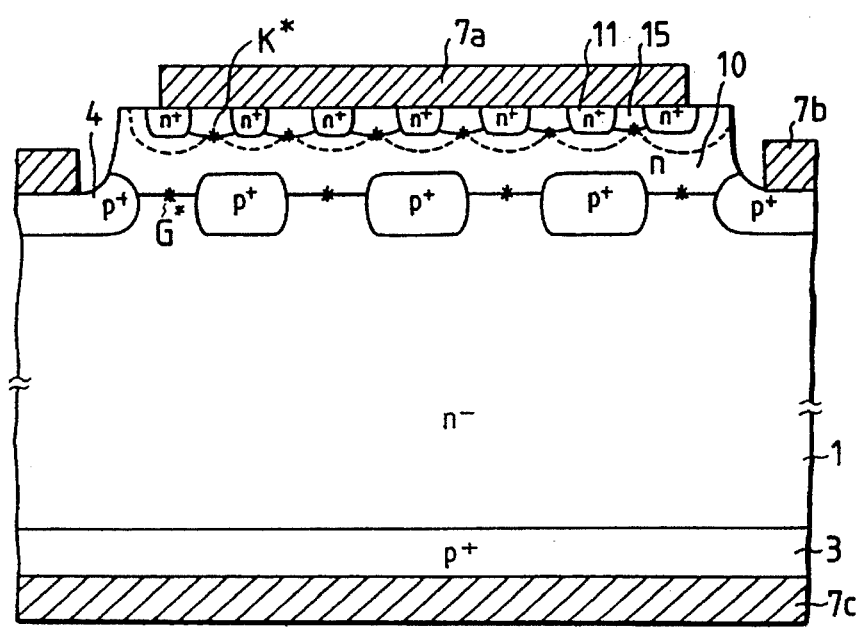
FIG. 2 is a schematic longitudinal-sectional view showing one unit segment portion of the SI semiconductor device according to a second embodiment of the present invention.

FIG. 2 is a schematic longitudinal-sectional view illustrating one segment portion of the SI semiconductor device according to a second embodiment of the present invention. The structural feature of this embodiment resides in the provision of a distributed cathode structure in which the n⁺-type cathode regions 11 are formed as if they are distributed with respect to the buried gate regions 4. The SI Schottky shorted region 15 is formed between adjacent n⁺-type cathode regions 11. The cathode electrode 7a and the Schottky cathode electrode 7a' are formed of the same material and as a unitary structure.

Embodiment 3

Figure 3:
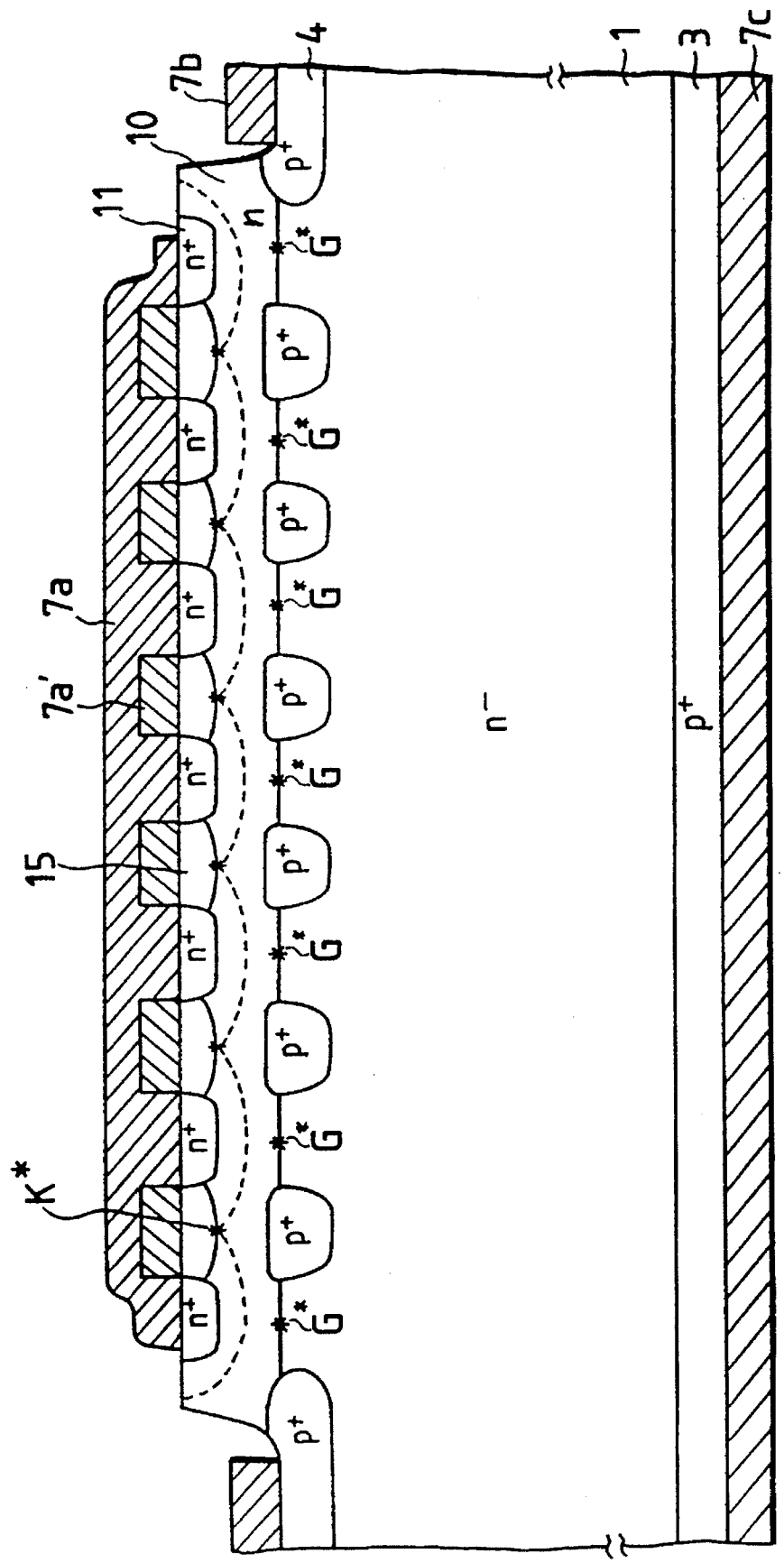
FIG. 3 is a schematic longitudinal-sectional view showing one unit segment portion of the SI semiconductor device according to a third embodiment of the present invention.

FIG. 3 is a schematic longitudinal-sectional view of one segment portion of the SI semiconductor device according to a third embodiment of the present invention. In the FIG. 1 embodiment two channels are provided widthwise of the segment and the SI Schottky shorted structure is provided in a stripe form lengthwise of the segment; in the FIG. 3 embodiment channels are formed widthwise of the segment of the SI semiconductor device and each SI Schottky shorted structure, which is formed in contact with the cathode electrode 7a just above one of the buried p$^+$-type gate regions 4, is also provided widthwise of the segment.

In this embodiment, the Schottky cathode electrode 7a' and the cathode electrode 7a, which makes ohmic contact with the n$^+$-type cathode regions 11, made up the cathode electrode assembly. Reference character K * denotes intrinsic cathode points and G * intrinsic gate points.

Embodiment 4

Figure 4:
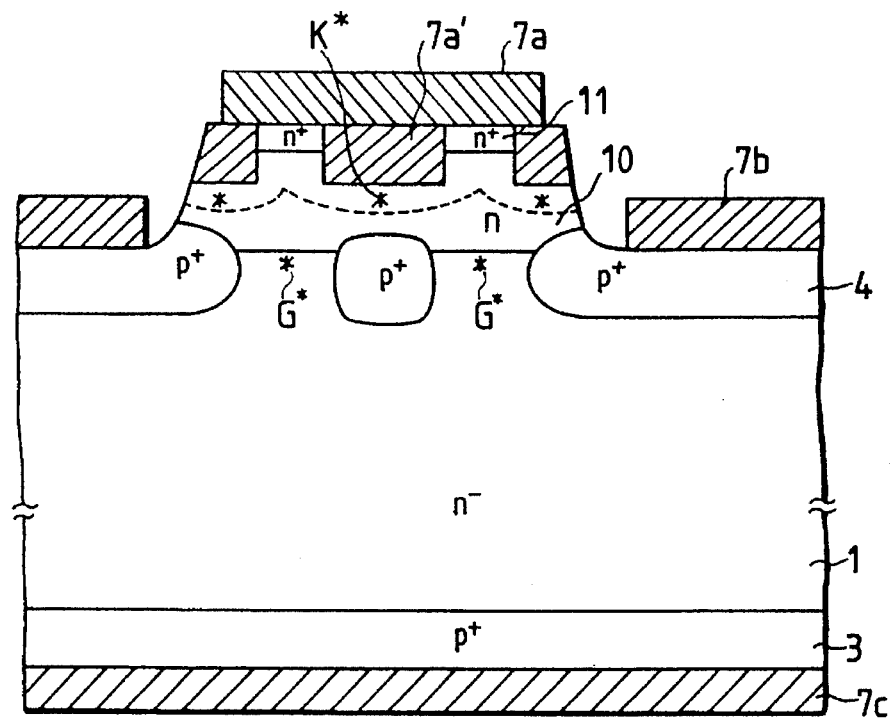
FIG. 4 is a schematic cross-sectional view showing one unit segment portion of the SI semiconductor device according to a fourth embodiment of the present invention.

FIG. 4 is a schematic cross-sectional view showing one segment portion of the SI semiconductor device according to a fourth embodiment of the present invention. This embodiment has its structural feature in that the Schottky cathode electrodes 7a are each formed protrusively downward and the n$^+$-type cathode regions 11 are each formed between adjacent Schottky cathode electrodes 7a'. In this embodiment, two n$^+$-type cathode regions 11 extend in a stripe form lengthwise of the segment and the Schottky cathode electrodes 7a' also disposed at both sides of the segment and at the center thereof so that the n$^+$-type cathode regions are sandwiched between them. The depletion layer that spreads in the n-type region 10 by the Schottky junction surrounds the n$^+$-type cathode regions 11. The intrinsic cathode point K * is formed in front of each Schottky cathode electrode 7a'. Since holes are easily stored near the Schottky cathode electrode 7a', the Schottky barrier height changes in terms of static induction with a potential change of the p$^+$-type gate region 4, causing the injection of electrons from the Schottky cathode electrode 7a' as well. On the other hand, the holes near the Schottky cathode electrode 7a' are absorbed thereinto and hence into the cathode electrode 7a adjacent the n$^+$-type cathode region 11.

Embodiment 5

Figure 5:
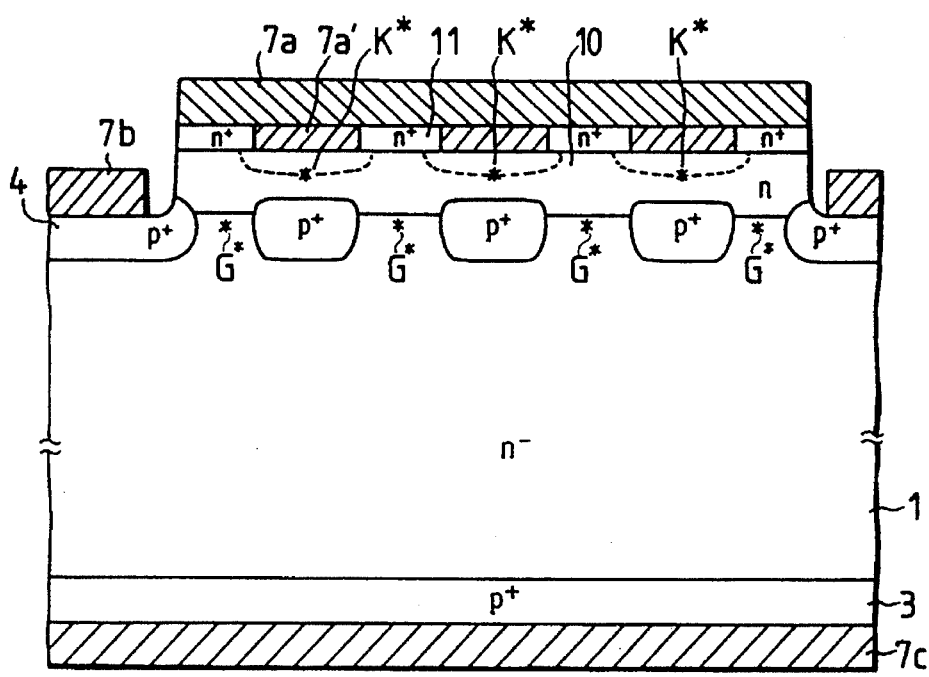
FIG. 5 is a schematic longitudinal-sectional view showing one unit segment portion of the SI semiconductor device according to a fifth embodiment of the present invention.

FIG. 5 is a schematic longitudinal-sectional view of one segment portion of the SI semiconductor device according to a fifth embodiment of the present invention. This embodiment has its structural feature in that its fabrication involves a manufacturing step used in the prior art. Conventionally, the cathode region 11 is formed over the entire area of the segment surface in the manufacture of a buried gate SI thyristor; in this embodiment, the n$^+$-type cathode region 11 is once formed all over the surface of the segment, then it is selectively removed by dry etching or the like to its full thickness to provide grooves, and then the Schottky cathode electrodes 7a' of a silicide, for example, are formed in the grooves by CVD or the like. The area of the segment surface where to provide the cathode electrode is made substantially flat and then the cathode electrode 7a, which makes ohmic contact with the cathode regions 11, are formed all over the flat surface area. The Schottky cathode electrodes 7a' are each formed to about the same as the width of the buried gate region 4 to provide excellent controllability of the Schottky barrier height according to a potential change of the gate region 4 by the static induction effect.

Embodiment 6

Figure 6:
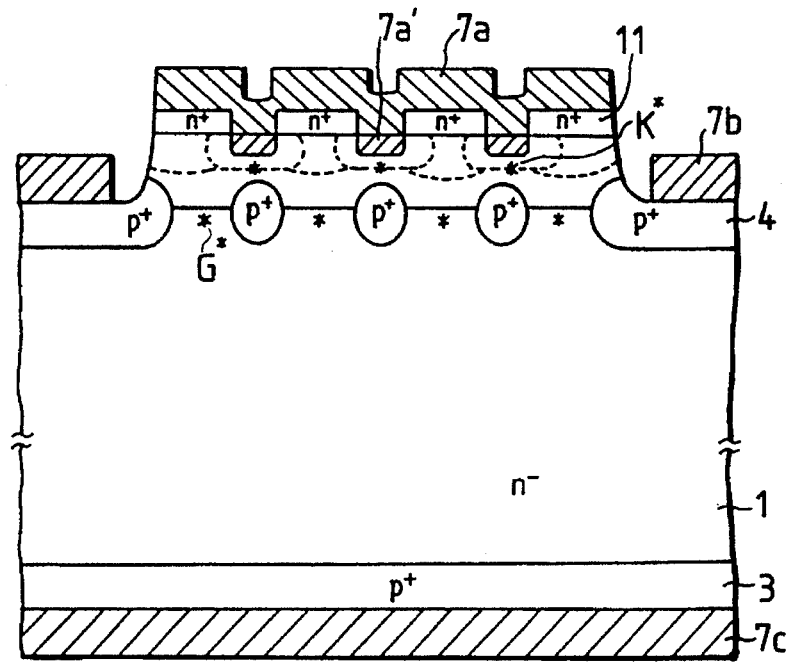
FIG. 6 is a schematic longitudinal-sectional view showing one unit segment portion of the SI semiconductor device according to a sixth embodiment of the present invention.

FIG. 6 is a schematic longitudinal-sectional view of one segment portion of the SI semiconductor device according to a sixth embodiment of the present invention. A structural feature of this embodiment resides in that the Schottky cathode electrodes 7a' are each disposed closer to the gate region 4 than in the FIG. 5 embodiment to enhance controllability of the Schottky barrier height by the gate region 4. That is, in this embodiment, the n$^+$-type cathode region 11 is formed all over the segment surface, then it is selectively etched away to a depth larger than its thickness, and then the Schottky cathode electrode 7a' is formed in the bottom of each groove. Finally, the cathode electrode 7a is formed which makes ohmic contact with the n$^+$-type cathode regions 11. By the potential at each intrinsic cathode point K * with the potential of the corresponding p$^+$-type gate region 4, excellent controllability of the Schottky barrier height is kept. The Schottky cathode electrodes 7a' may preferably be formed of molybdenum (Mo), titanium (Ti), tungsten (W), platinum (Pt), or their siliconbase alloys or silicides, but they may also be formed of aluminum (Al) which is used for the cathode electrode 7a.

Embodiment 7

Figure 7:
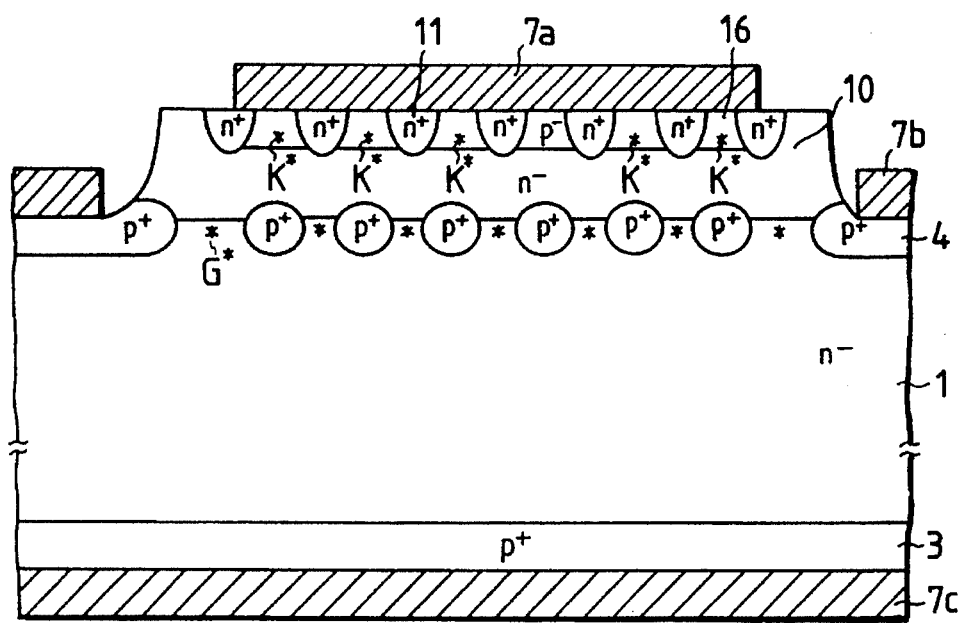
FIG. 7 is a schematic longitudinal-sectional view showing one unit segment portion of the SI semiconductor device according to a seventh embodiment of the present invention.

FIG. 7 is a schematic longitudinal-sectional view of one segment portion of the SI semiconductor device according to a seventh embodiment of the present invention. A structural feature of this embodiment lies in that a p$^-$-type region for adjusting the Schottky barrier height is formed shallow in the surface portion of each n-type region 10 sandwiched between the n$^+$-type cathode regions 11. Since the Schottky barrier height is determined by the material of the cathode electrode 7a and the conductivity and impurity density of the semiconductor substrate used, the Schottky barrier height can be adjusted by forming the p$^-$-type regions 16 to such a shallow depth as to be influenced by the Schottky potential.

Embodiment 8

Figure 8:
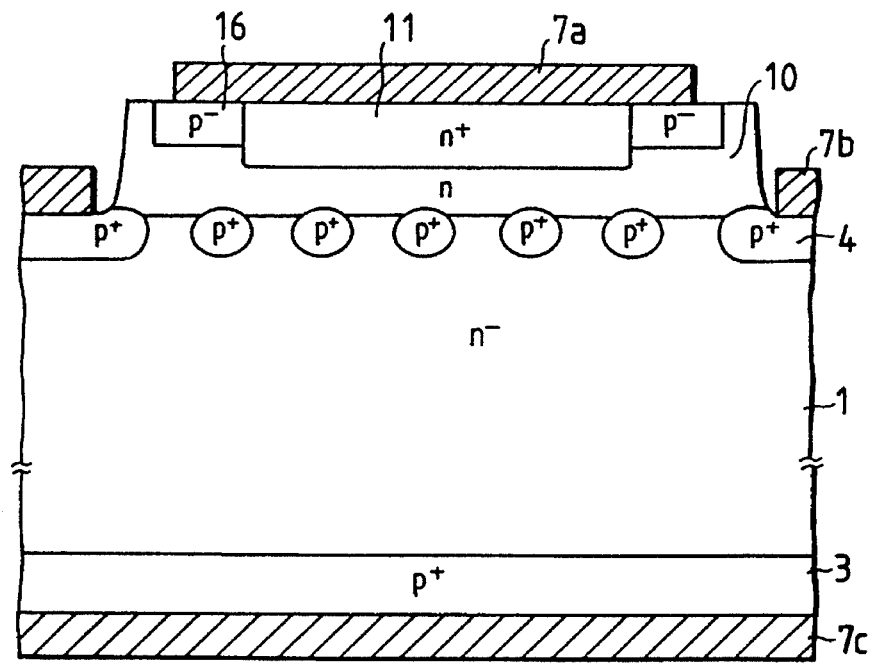
FIG. 8 is a schematic longitudinal-sectional view showing one unit segment portion of the SI semiconductor device according to an eighth embodiment of the present invention.

FIG. 8 is a schematic longitudinal-sectional view of one segment portion of the SI semiconductor device according to an eighth embodiment of the present invention. A structural feature of this embodiment lies in that an SI Schottky cathode region is formed at either side of the n$^+$-type cathode region 11 of the same shape as in the conventional buried gate SI thyristor to form an SI Schottky shorted structure in combination with the n$^+$-type cathode region 11. That is, in this embodiment, a Schottky junction (between the cathode electrode 7a and the p$^-$-type layer 16) is formed along each marginal edge of the n$^+$-type cathode region 11. The p$^-$-type layer 16 is provided to adjust the Schottky barrier height as in the FIG. 7 embodiment. The Schottky barrier height can be changed by the potential of each p$^+$-type buried gate region 4 with a high degree of controllability. It is also possible to control the SI Schottky short-circuit effect by changing the short-circuit ratio of the SI Schottky junction to the n$^+$-type cathode region 11 by spacing the p$^-$-type regions 16 apart as predetermined.

Embodiment 9

Figure 9:
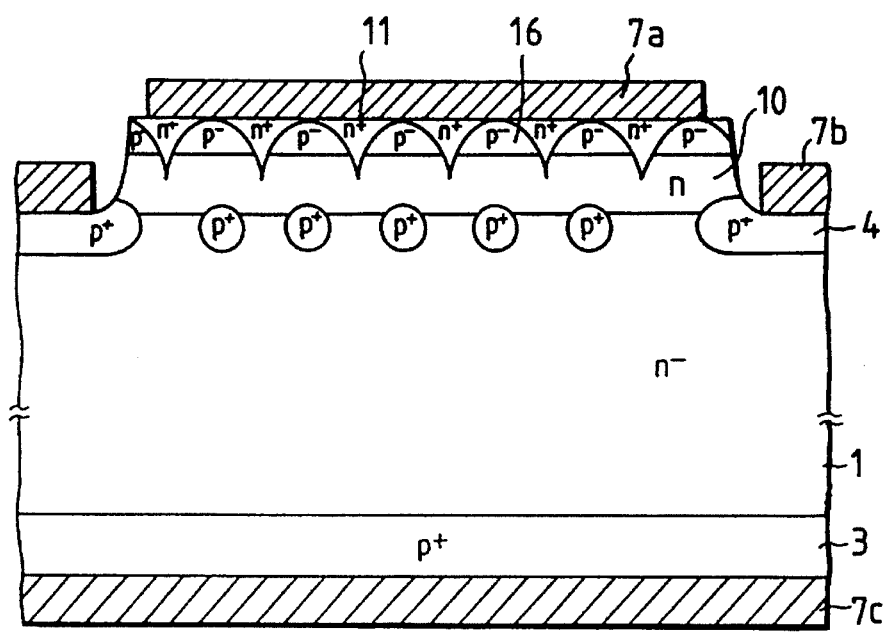
FIG. 9 is a schematic longitudinal-sectional view showing one unit segment portion of the SI semiconductor device according to a ninth embodiment of the present invention.

FIG. 9 is a schematic longitudinal-sectional view of one segment portion of the SI semiconductor device according to a ninth embodiment of the present invention. In this embodiment the n$^+$-type cathode region 11 is formed by anodization or the like so that it extends down, in a triangular or more sharply pointed form as shown, to the vicinity of each channel region sandwiched between the buried gate regions 4 to reduce the channel length. Furthermore, the p⁻-type regions 16 are formed in the surface layer of the n-type layer 10 to control the Schottky barrier height. As in the embodiments described above, electrons are injected from the pointed portions of the n⁺-type cathode region 11 and the Schottky junction formed between the cathode electrode 7a and the p⁻-type regions 16.

Embodiment 10

Figure 10:
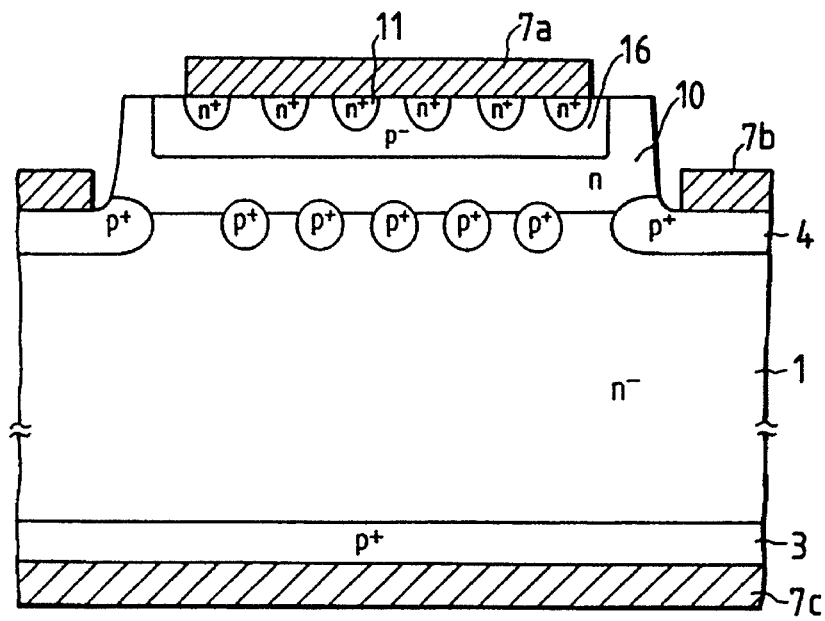
FIG. 10 is a schematic longitudinal-sectional view showing one unit segment portion of the SI semiconductor device according to a tenth embodiment of the present invention.

FIG. 10 is a schematic longitudinal-sectional view showing one segment portion of the SI semiconductor device according to a 10th embodiment of the present invention. In this embodiment a plurality of n⁺-type cathode regions 11 are provided as a distributed cathode structure in the SI thyristor segment and they are formed in a well-structures p⁻-type layer 16 as a whole. Since the overall potential of the p⁻-type layer 16 is controlled by the height is also controlled by the potential of the p⁺ -type gate regions. The p⁻-type layer 16 is provided to adjust the SI Schottky barrier height as in the foregoing embodiments.

Embodiment 11

Figure 11:
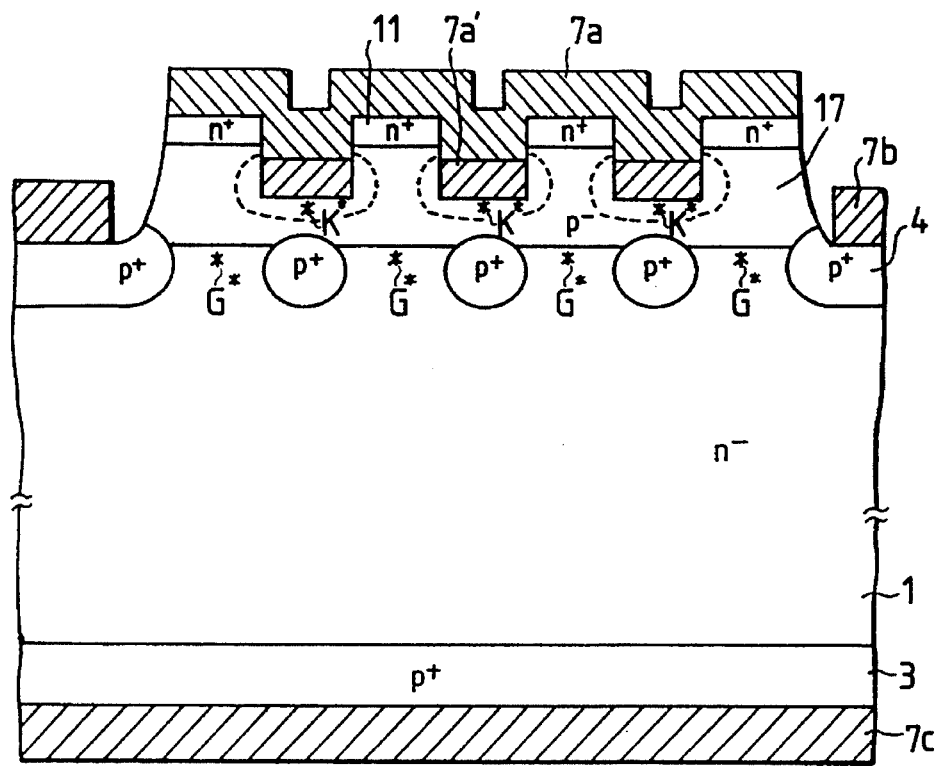
FIG. 11 is a schematic longitudinal-sectional view showing one unit segment portion of the SI semiconductor device according to an eleventh embodiment of the present invention.

FIG. 11 is a schematic longitudinal-sectional view of one segment portion of the SI semiconductor device according to an 11th embodiment of the present invention. In this embodiment the Schottky cathode electrodes 7a' are each formed in the bottom of a groove made deeper than in the FIG. 6 embodiment to further enhance the controllability of the Schottky barrier height by the gate potential. Another structural feature resides in that the n-type epitaxial layer 17 between the p⁺-type buried gate regions 4 and the n⁺-type cathode region 11 is replaced with a p⁻-type layer. With the provision of the p⁻-type layer 17, the Schottky barrier height is adjusted and a normally-off characteristic is implemented in the control of the electron injection from the n⁺-type cathode regions 11 and the SI Schottky junction formed between each Schottky cathode electrode 7a' and the p⁻-type layer 17.

Embodiment 12

Figure 12:
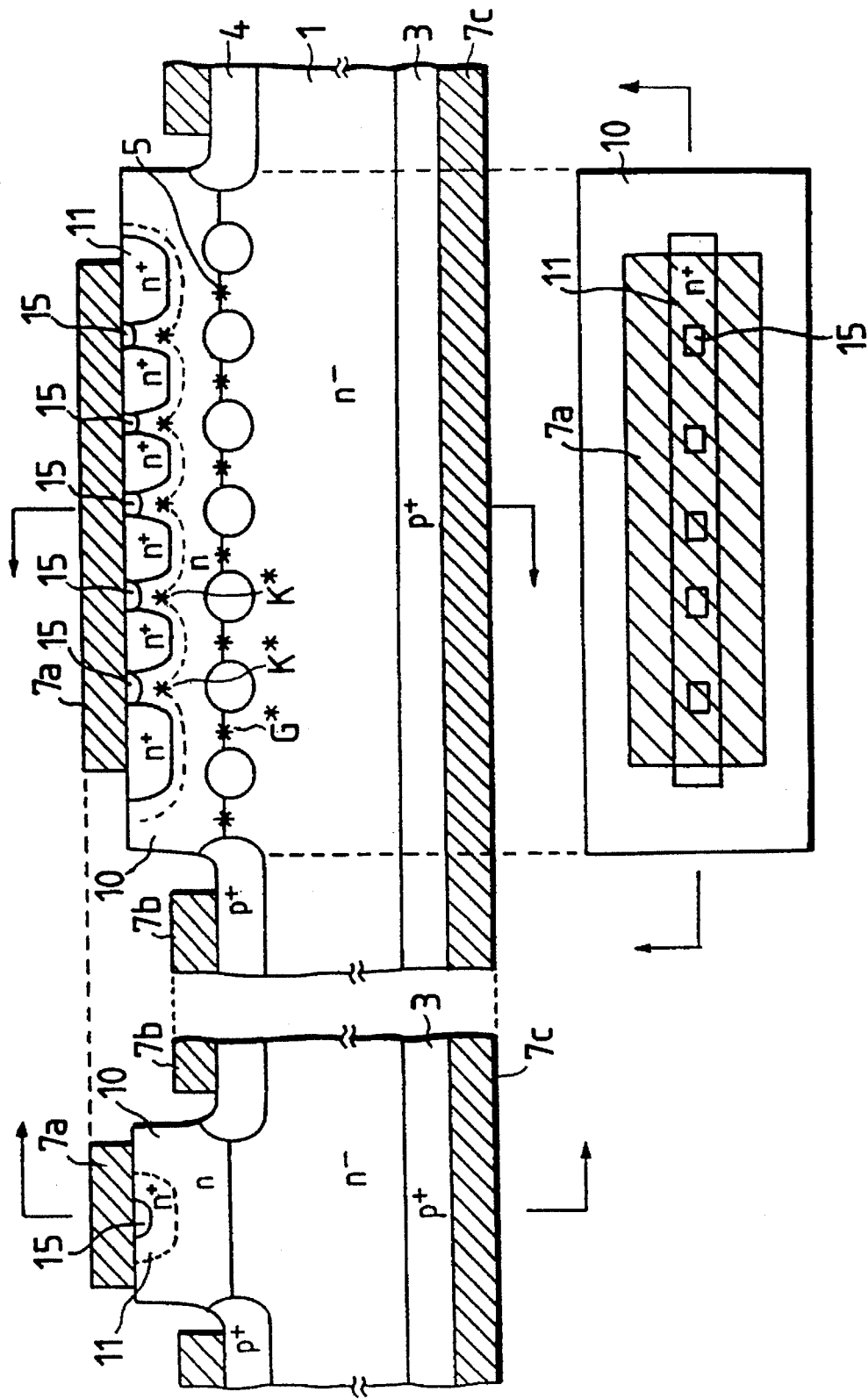
FIG. 12 schematically shows sectional and top views of one unit segment portion of the SI semiconductor device according to a twelfth embodiment of the present invention.

FIG. 12 schematically shows sectional and top plan views of one segment portion of the SI semiconductor device according to a 12th embodiment of the present invention. The illustrated device is an SI thyristor since the p⁺-type region 3 is formed as an anode region. If the region 3 is n⁺-type, then the device will serve as an SI transistor. This embodiment will be described as the SI thyristor. Reference numeral 1 denotes an n⁻-type high resistivity layer, 4 p⁺-type buried gate regions, 5 channel regions, 7a a cathode electrode, 7b a gate electrode, 7c an anode electrode, 10 an n-type region formed by epitaxial growth or like method, 11 an n⁺-type cathode region, and 15 Schottky cathode shorted regions. A structural feature of this embodiment resides in that the cathode electrode 7a makes Schottky contact not only with the n⁺-type cathode region 11 but also with the Schottky cathode shorted regions. Consequently, the n⁺-type cathode region 11 is shorted to the Schottky cathode shorted regions 15 via the cathode electrode 7a. The cathode electrode 7a is formed of aluminum (Al), an aluminum-silicon (Al-Si) alloy, molybdenum (Mo), tungsten (W), platinum (Pt), titanium (Ti), nickel (Ni), or their alloys or silicides. The cathode electrode 7a makes ohmic contact with the n⁺-type cathode region 11 but non-ohmic contact, that is, Schottky contact with the Schottky cathode shorted regions 15. In order that holes distributed in the n-type region 10 may easily be stored in the Schottky junction interface between the n-type region 10 and the n⁺-type cathode region 11, an impurity density difference is set between the both regions 10 and 11; furthermore, the structure of this embodiment facilitates absorption of the holes by the Schottky cathode shorted regions 15. As is evident from the top plan view, the n⁺-type cathode region 11 is provided in a stripe form and is surrounded by the n-type region 10 to form a distributed cathode region. The cathode electrode 7a is in contact with the both regions to form a distributed cathode electrode structure.

The n-type region 10 needs only to easily store holes and may be formed as a p⁻-type region lower in impurity density than the gate region 4. Also in this case, the cathode electrode 7a makes Schottky contact with the region 10.

As will be seen from the potential distributions shown in FIGS. 32 through 34, a potential barrier whose height is controlled by the Static Induction effect is formed in the depleted region between each Schottky cathode shorted region 15 and the corresponding gate region 4, by which the flow of carriers (holes) between the both regions is controlled.

That is, the Schottky cathode shorted regions 15 are each shorted to the cathode region 11 on both side thereof, and in the n-type region 10 surrounded by the opposed portions of the cathode region 11 a depletion layer spreads owing to the diffusion potential of the n⁺ (11)n(10) junction. Such depletion layers link together to form a potential barrier against holes directly below the respective Schottky cathode shorted region 15. The positions of intrinsic cathode points K * where the potential barrier height is maximum are indicated schematically in FIG. 12. As is evident from the potential distribution for holes shown in FIGS. 32 through 34, holes distributed in the region further to the surface than the intrinsic cathode point K * are efficiently absorbed by the Schottky cathode shorted regions 15. Such Schottky cathode shorted regions 15 are each what is called a drain region for the holes that are absorbed by the cathode electrode 7a. In the SI Schottky shorted structure, since the Schottky barrier height is controlled by the Static Induction effect according to the gate potential, the electron injection from the main electrode can be started and stopped very efficiently.

Embodiment 13

Figure 13:
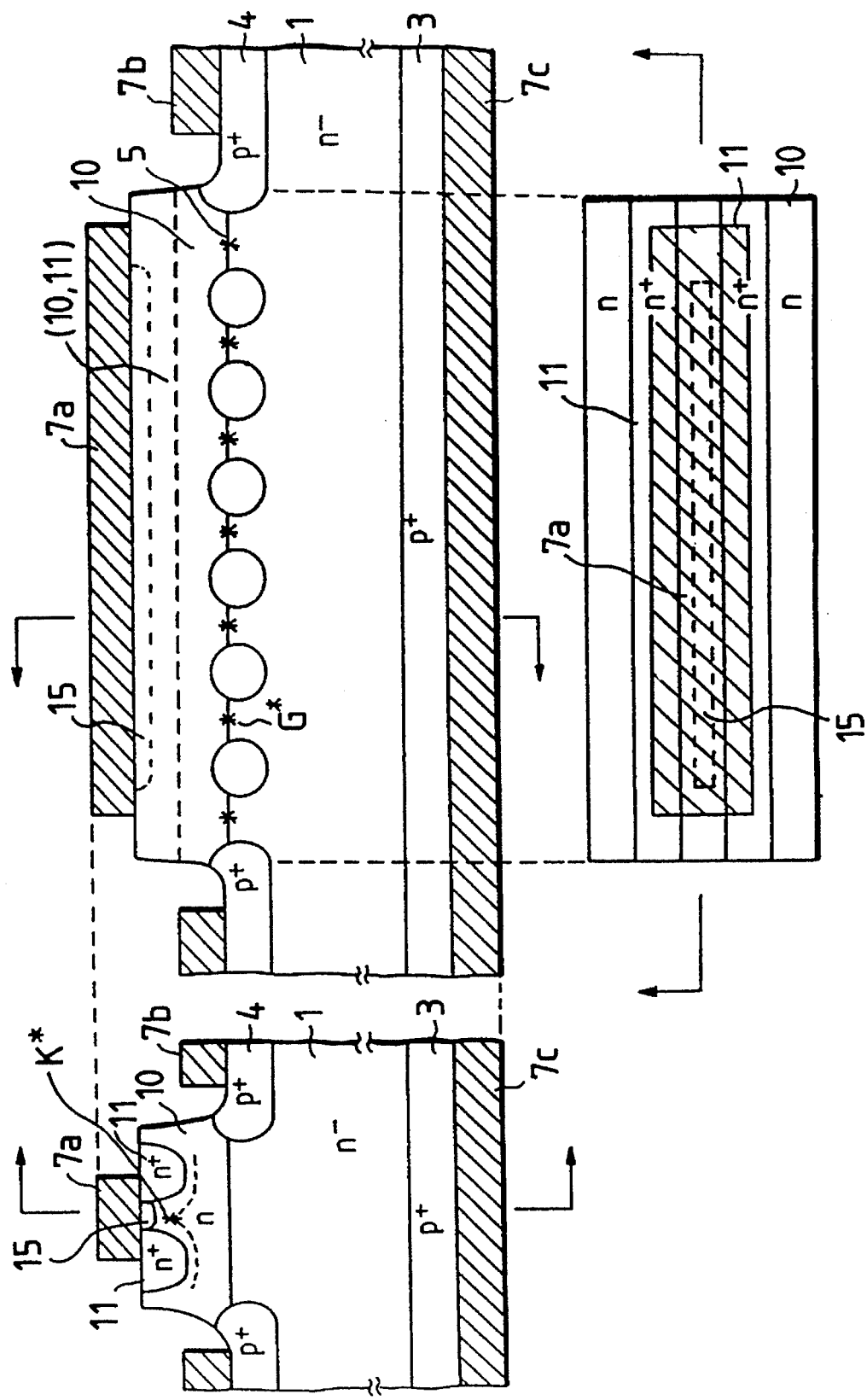
FIG. 13 schematically shows sectional and top views of one unit segment portion of the SI semiconductor device according to a thirteenth embodiment of the present invention.

FIG. 13 schematically shows sectional and top plan views of unit segment portion of the SI semiconductor device according to a 13th embodiment of the present invention. The device of this embodiment is a buried-gate type SI thyristor. This embodiment features a construction in which the Schottky cathode shorted region 15 is formed in that portion of the n-type region 10 that is sandwiched between two parallel n⁺-type cathode regions 11 and the cathode electrode 7a makes Schottky contact with the Schottky cathode shorted region 15 sandwiched between the n⁺-type regions 11.

With the introduction of such a Schottky cathode shorted structure into the distributed main electrode (cathode) structure, holes that are stored in the n-type region 10 of the lower impurity density can efficiently be absorbed to the cathode electrode 7a through the Schottky cathode shorted region 15. As is evident from the top plan view, the n⁺-type cathode regions 11 are two parallel stripe-like regions and the Schottky cathode shorted region 15 is formed in the n-type region 10 sandwiched between the two cathode regions 11. The cathode electrode 7a is deposited so that it makes contact with an $n^+\pi(11)$–$n(10, 15)$–$n^+$ (11) region. The cathode electrode 7a is in ohmic contact with the $n^+$-type cathode regions 11 and in Schottky contact with the n-type region 10. The n-type region 10 may also be formed as a $p^-$- or p-type region lower in impurity density than the $p^+$-type gate region 4.

Embodiment 14 and 15

Figure 14:
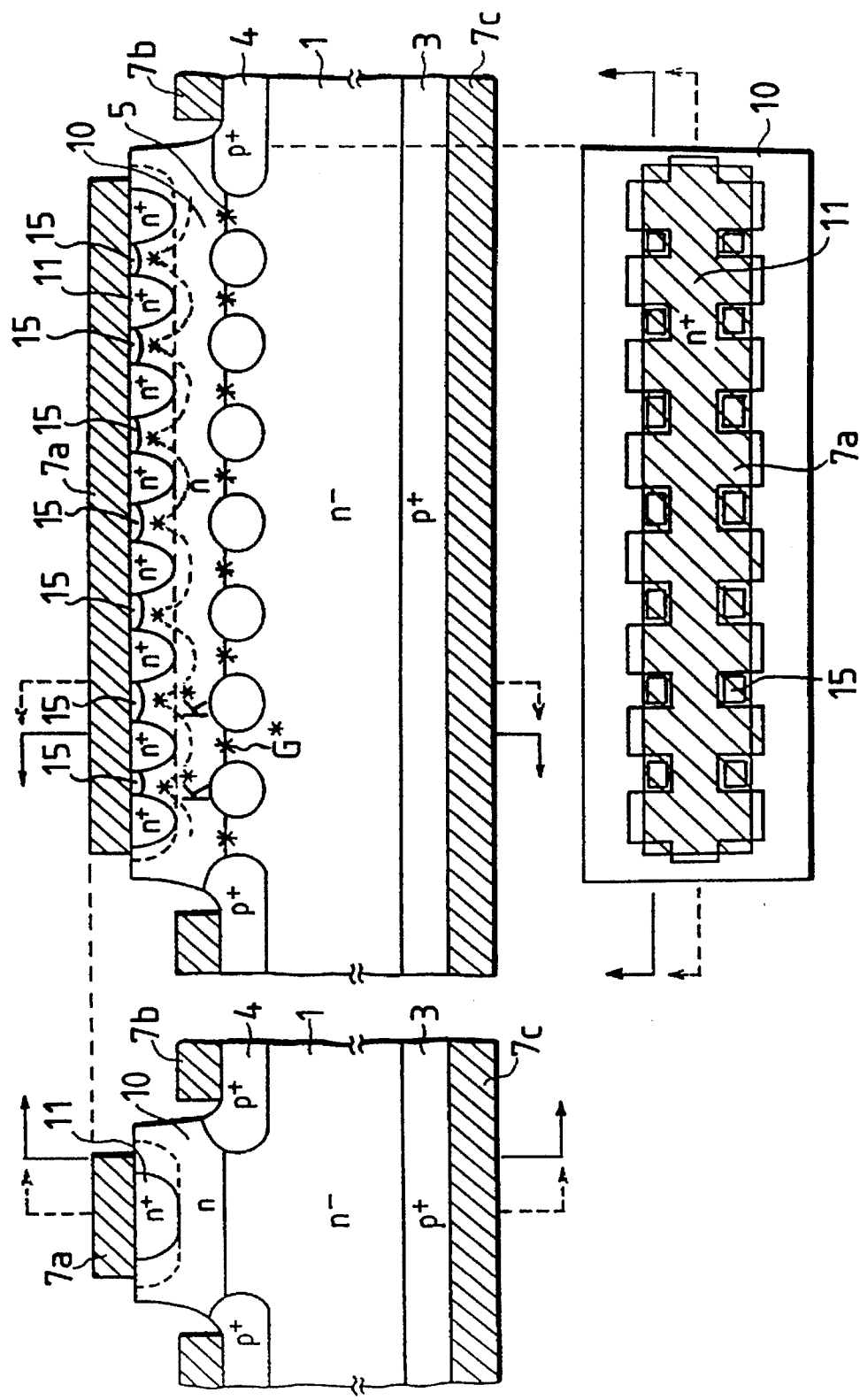
FIG. 14 schematically shows sectional and top views of one unit segment portion of the SI semiconductor device according to a fourteenth embodiment of the present invention.
Figure 15:
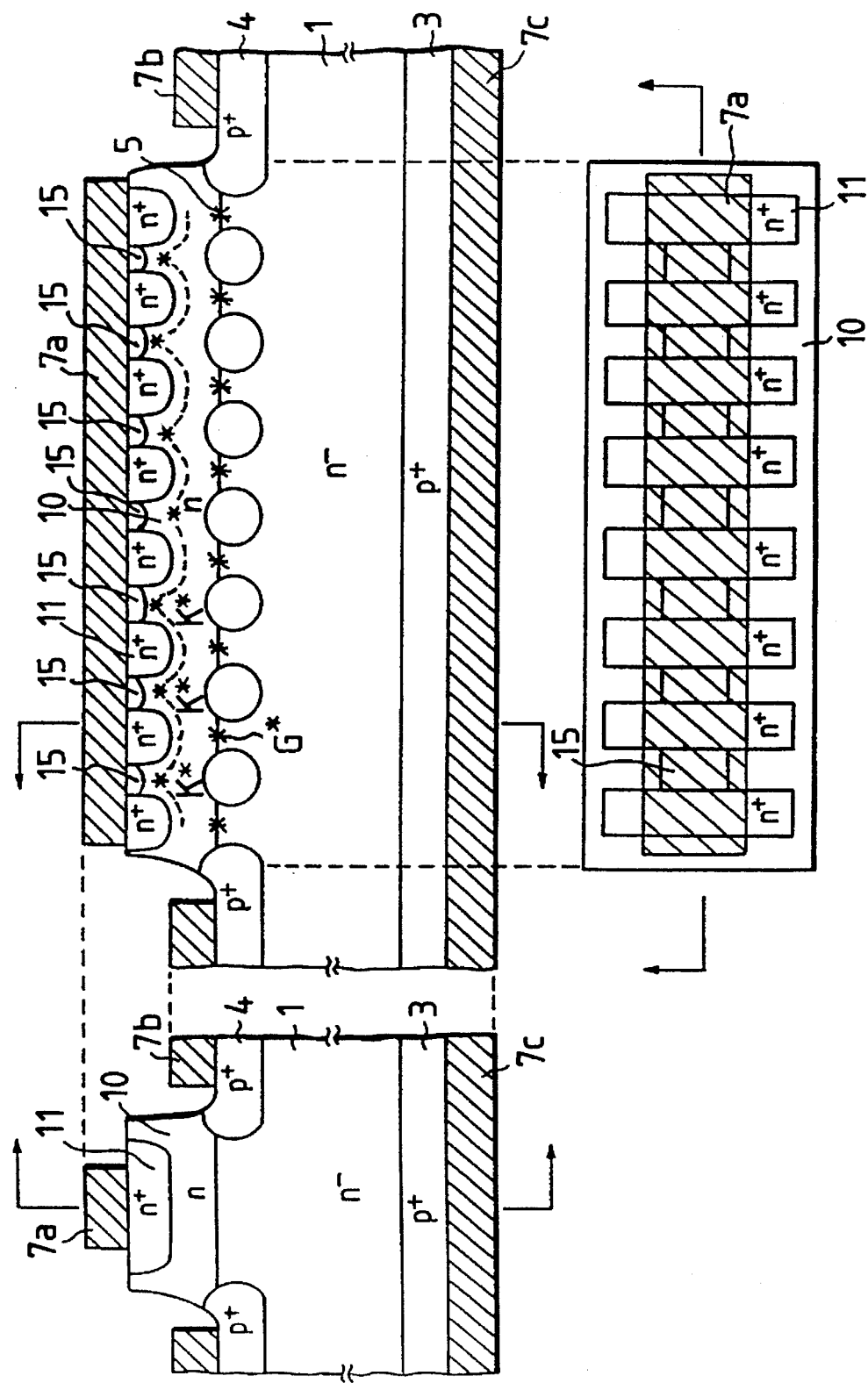
FIG. 15 schematically shows sectional and top views of one unit segment portion of the SI semiconductor device according to a fifteenth embodiment of the present invention.

FIGS. 14 and 15 schematically show sectional views and top plan views of unit segment portions of SI semiconductor devices according to 14th and 15th embodiments of the present invention.

Structural features of these embodiments reside in the layout pattern of the $n^+$-type cathode region 11 and the SI Schottky cathode shorted region 15. That is, to solve the afore-mentioned problem of the prior art that only $p^+$-type buried-gate regions 4 directly under the $n^+$-type cathode 11 spread wide and hence introduce dispersion in the gate-cathode withstand voltage distribution, the $n^+$-type cathode region 11 is subdivided into smaller regions and the SI Schottky cathode shorted regions 15 are each formed in that portion sandwiched between the cathode regions 11. Since the subdivided cathode regions 11 are disposed in those portions of the $n^-$-type region 10 where the channel regions 5 are formed, the variations in the diffusion depth between the gate and the cathode in the unit segment are alleviated and the gate-cathode withstand voltage distribution also becomes uniform.

In Embodiment 14, the $n^+$-type cathode regions 11 are combined with a stripe-shaped cathode region into a unitary structure and the cathode electrode 7a is formed in contact with a distributed cathode region composed of the $n^+$-type cathode regions and the n-type region 10 and the SI Schottky cathode shorted regions 15 as depicted in the top plan view.

In Embodiment 4 of FIG. 4 the $n^+$-type cathode regions 11 are spaced apart and the SI Schottky cathode shorted regions 15 are each provided in that portion of the n-type region 10 which is sandwiched between adjacent $n^+$-type cathode regions 11. The cathode electrode 7a extends across a distributed cathode short-circuit region [$n^+$ (11)–$n^-$(10,15)–$n^+$ (11)–$n^-$ (10,15) . . . ] and makes contact with it.

In these embodiments, the cathode electrode 7a makes ohmic contact with the cathode regions 11 and non-ohmic or Schottky contact with the $n^-$-type region 10 (the SI Schottky cathode shorted region 15). The n-type region 10 may also be provided as a $p^-$-or p-type region. The point is to offer a structure in which holes are stored in such a lower impurity density region 10 or the SI Schottky cathode shorted regions 15 and are readily absorbed into the cathode electrode 7a.

In these embodiments, the SI Schottky shorted structure is implemented as in Embodiments 1 through 13 described previously. That is, the SI Schottky cathode shorted regions 15 are shorted to the $n^+$-type cathode regions 11, and owing to the diffusion potential by the $n^+$ (11)n(10) junction, a depletion layer spreads in the n-type region 10 sandwiched between adjacent $n^+$-type cathode regions 11. Such depletion layers link together to form a potential barrier against holes in front of each SI Schottky cathode shorted region 15. The position where the potential barrier height is maximum is the intrinsic cathode point K * indicated schematically in FIGS. 14 and 15. As will be understood from the potential distribution for holes depicted in FIGS. 32 through 34, holes stored in the region closer to the cathode than the intrinsic cathode point K* are efficiently absorbed by the SI Schottky cathode shorted regions 15. The introduction of such SI Schottky cathode shorted regions 15 is equivalent to the formation of so-called drain regions for holes that are absorbed into the cathode electrode 7a. In the SI Schottky shorted structure the Schottky barrier height is controlled by the Static Induction effect according to the potential of the control region (i.e. the gate region). Hence, electrons can be injected from the main electrode (i.e. the cathode or source) through the Schottky junction. The electron injection through the Schottky junction can easily be stopped by applying a reverse bias to the gate.

Embodiments 16 and 17

Figure 16:
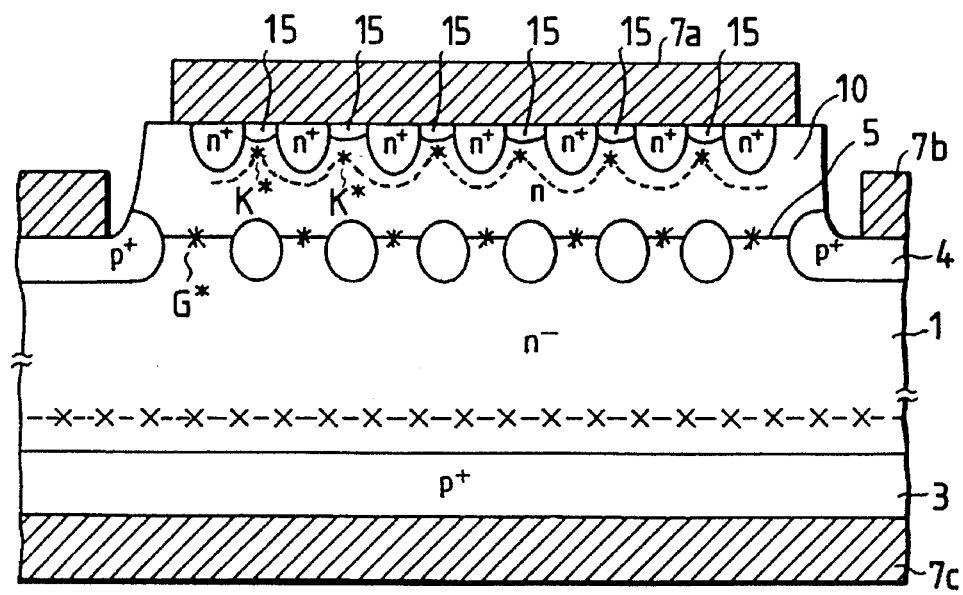
FIG. 16 schematically shows a sectional view of one unit segment portion of the SI semiconductor device according to a sixteenth embodiment of the present invention.
Figure 17:
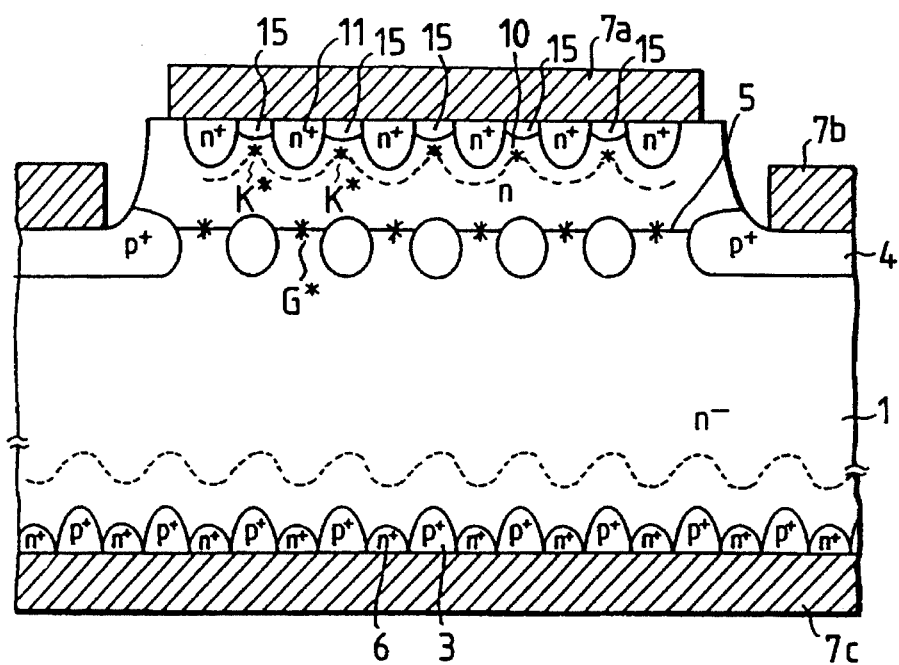
FIG. 17 schematically shows a sectional view of one unit segment portion of the SI semiconductor device according to a seventeenth embodiment of the present invention.

FIGS. 16 and 17 schematically illustrate, in section, unit segment portions of SI semiconductor devices with the SI main electrode shorted structure according to 16th and 17th embodiments of the present invention. The structure shown in each of FIGS. 16 and 17 is that of the buried gate type SI thyristor. As in Embodiments 14 and 15, the $n^+$-type cathode region 11 is subdivided into smaller regions and the Schottky cathode shorted regions 15 which utilize the static induction effect are formed between the cathode regions 11. As compared with the distributed main electrode structure with no main electrode shorted structure, the SI Schottky cathode shorted structure according to the present invention decreases the quantity of gate pull-out charges and reduces the turn-off time $t_{gq}$ that is the sum of the minority carrier storage period $t_s$ and the fall period $t_f$. It is difficult however, to shorten the tail period $t_{tail}$ unique to the thyristor structure, through the use of the distributed main electrode (cathode) electrode structure alone. Embodiment 16 combines the SI Schottky cathode shorted structure with life time control. The life time control is effected by proton, electron beam or gamma-ray irradiation, or heavy metal diffusion. In FIG. 16 crosses (x) indicate the positions where to form desirable defect regions in the case of the proton irradiation. For instance, when the $p^+$-type anode region 3 is about 5 μm thick, the defect regions are formed about 15 μm above the anode region 3. The defect regions formed near the anode region 3 permits effective control of the life time of electrons and reduction of the tail period.

On the other hand, Embodiment 17 of FIG. 17 combines the SI Schottky cathode shorted structure and the SI anode shorted structure. Reference numeral 6 denotes an $n^+$-type short-circuit layer. The anode shorted structure shown in FIG. 17 is one that utilizes the Static Induction effect and hence is an SI anode shorted structure. With the combined use of the SI Schottky cathode shorted structure and the SI anode shorted structure, it is possible to shorten the turn-off time $t_{gq}$ and the tail period $t_{tail}$. It is a matter of course that Embodiment 17 further utilizes the life time control.

Also in Embodiments 16 and 17, a potential barrier controllable by the Static Induction effect is formed in front of each Schottky cathode shorted region 15, which serves as a drain for holes that are absorbed into the cathode electrode 7a. The quantity of electron injection from the main electrode 7a is controlled by the Schottky barrier height.

Embodiments 18, 19 and 20

Figure 18:
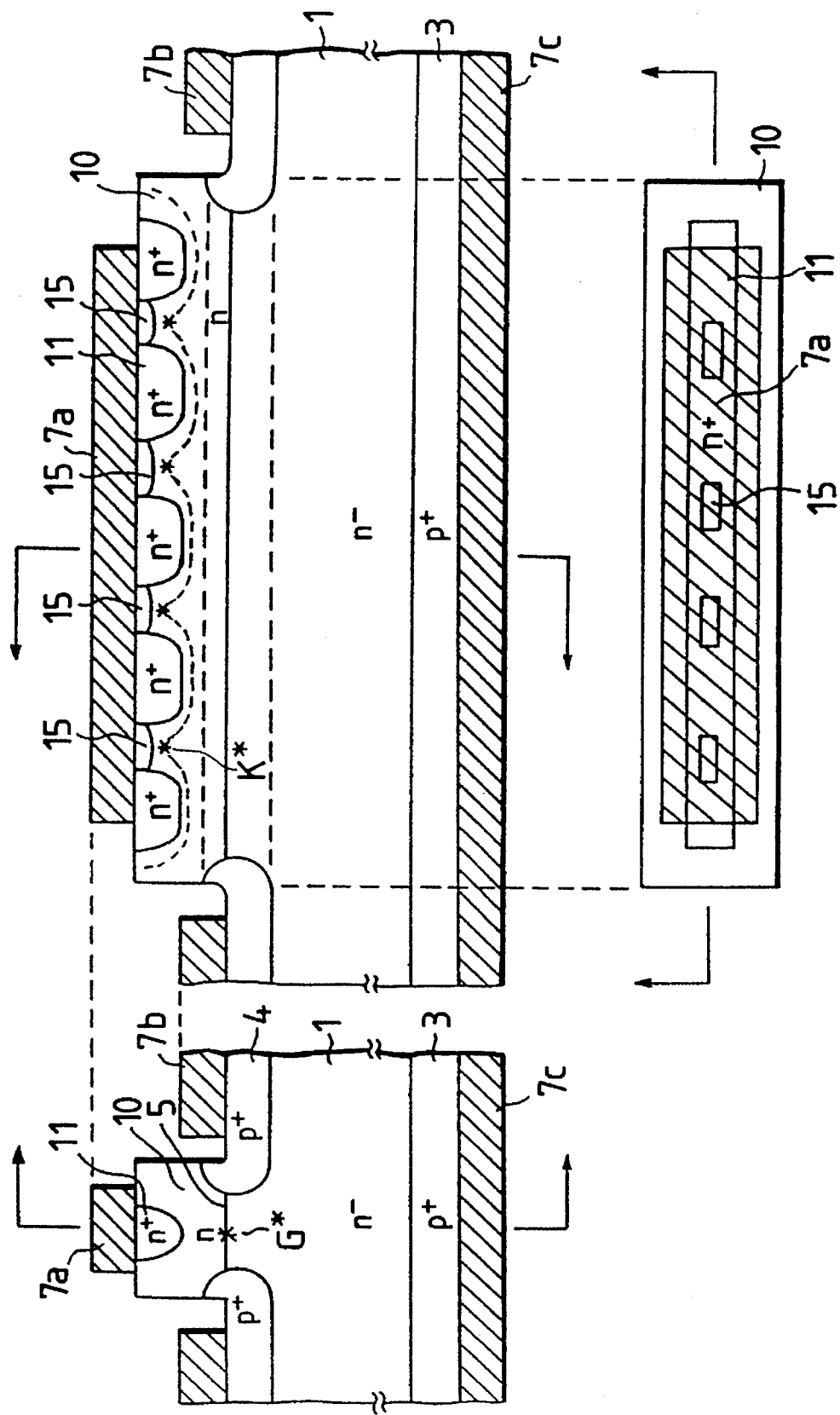
FIG. 18 schematically shows sectional and top views of one unit segment portion of the SI semiconductor device according to an eighteenth embodiment of the present invention.
Figure 19:
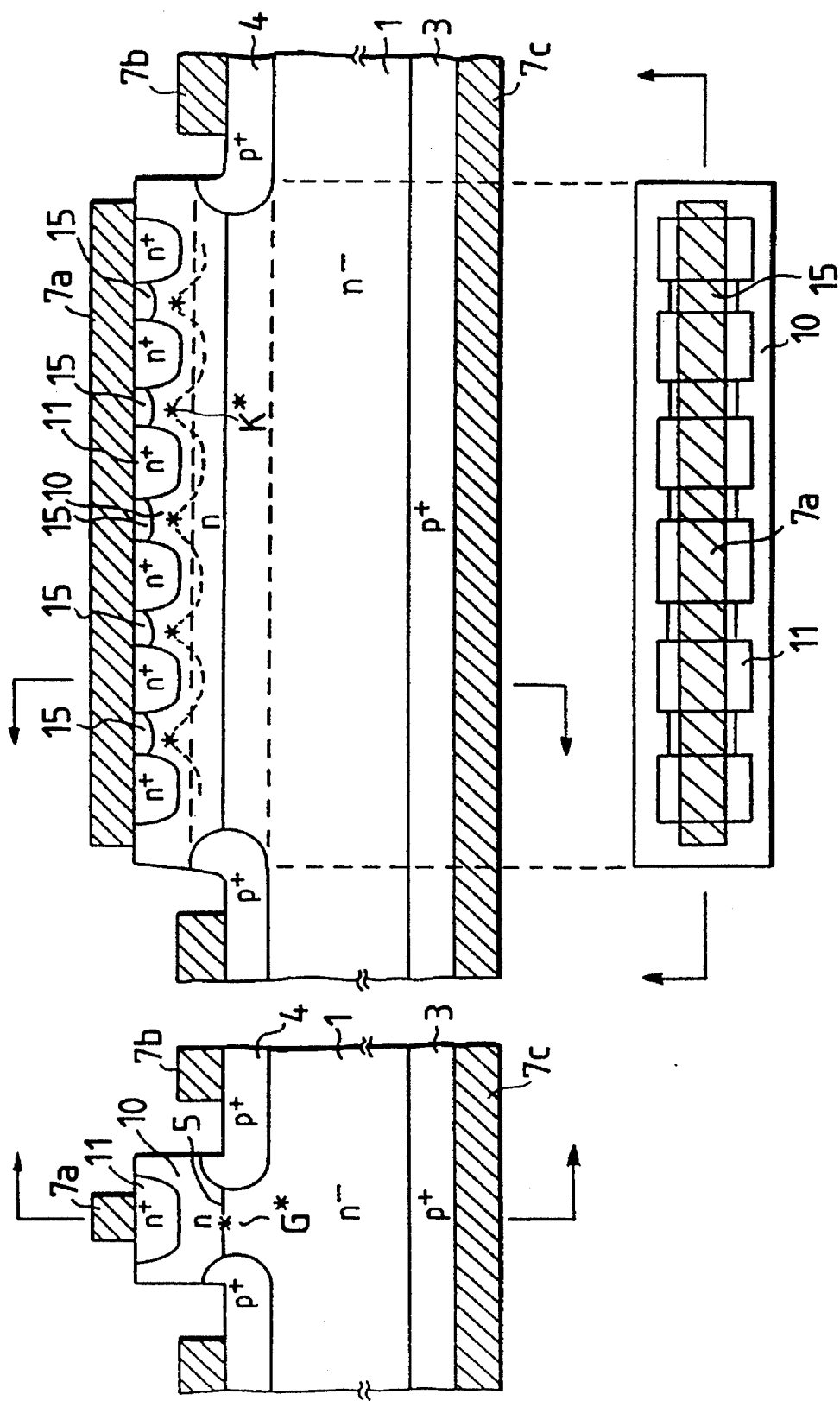
FIG. 19 schematically shows sectional and top views of one unit segment portion of the SI semiconductor device according to a nineteenth embodiment of the present invention.
Figure 20:
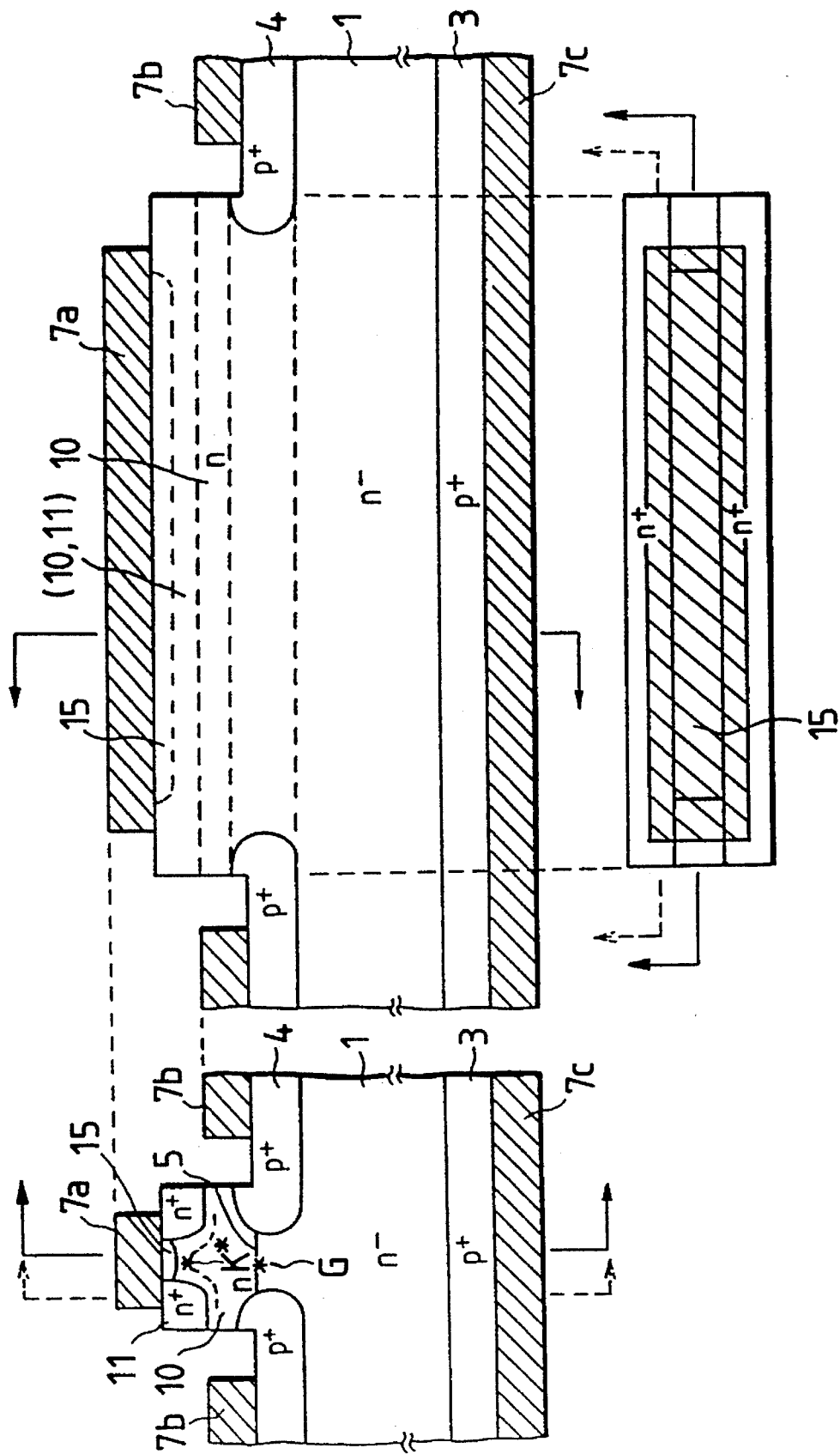
FIG. 20 schematically shows sectional and top views of one unit segment portion of the SI semiconductor device according to a twentieth embodiment of the present invention.

FIGS. 18, 19 and 20 schematically illustrate sectional views and top plan views of unit segment portions of SI semiconductor devices according to 18th, 19th and 20th embodiments of the present invention. The devices of these embodiments are each an SI thyristor with the recessed gate structure and feature the SI Schottky cathode shorted structure.

As will be seen from FIG. 18, in Embodiment 18 the $n^+$-type cathode region 11 is formed as a stripe-shaped region and the cathode electrode 7a is formed in contact with a distributed cathode region [$n^+$ (11)–n(10)] and the SI Schottky cathode shorted regions 15 each surrounded by the cathode regions 11.

In Embodiment 19, as is evident from FIG. 19, the $n^+$-type cathode region 11 is subdivided into smaller regions and the cathode electrode 7a is formed in contact with the distributed cathode region [$n^+$ (11)–n(10)] and the SI Schottky cathode shorted regions sandwiched between the cathode regions 11.

In Embodiment 20, as is evident from FIG. 20, the $n^+$-type cathode region 11 is formed as two parallel stripe-like regions to define therebetween the n-type region 10, in which the Schottky cathode shorted region 15 is formed. The cathode electrode 7a is formed in contact with the [$n^+$ (11)–n(10)] distributed cathode region and the [$n^+$ (11)–$n^-$/$p^-$ (15)–$n^+$ (11)] SI Schottky cathode shorted region. This construction allows efficient absorption of holes into the cathode electrode 7a from the SI Schottky cathode shorted region 15 sandwiched between the $n^+$-type cathode regions 11.

While Embodiments 18 through 20 have each been described as being applied to an SI thyristor, it is also possible to form a recessed gate SI transistor by forming an $n^+$-type drain region in place of the $p^+$-type anode region 3.

The cathode electrode 7a makes ohmic contact with the $n^+$-type cathode region 11 and non-ohmic or Schottky contact with the SI Schottky sorted region 15. The n-type region 10 may also be provided as $p^-$- or p-type region lower in impurity density than the $p^+$-type gate regions 4.

In these embodiments, the potential barrier height is maximum at the intrinsic cathode point K * opposite each Schottky cathode shorted region 15, and the hole current is controlled accordingly. The holes stored in the region further to the above than the intrinsic cathode point K * are efficiently absorbed to the Schottky cathode shorted region 15.

Embodiments 21 and 22

Figure 21:
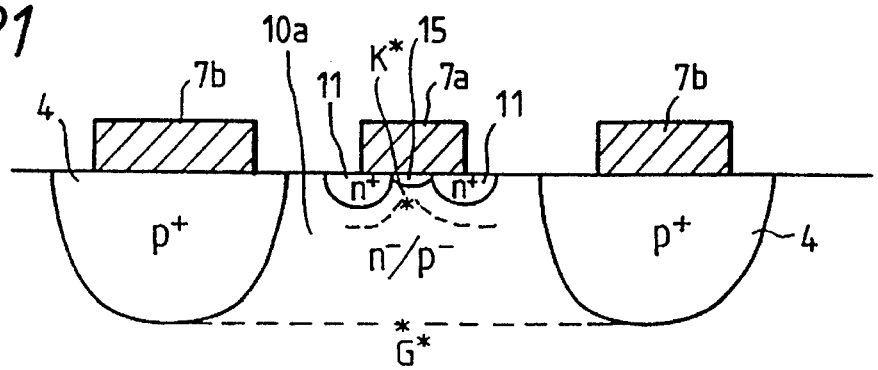
FIG. 21 is a schematic sectional view illustrating the main electrode and its vicinity in the SI semiconductor device according to a twenty-first embodiment of the present invention.
Figure 22:
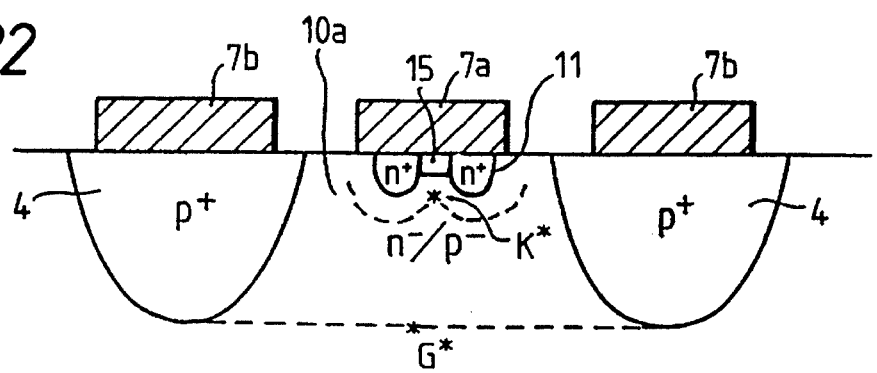
FIG. 22 is a schematic sectional view illustrating the main electrode and its vicinity in the SI semiconductor device according to a twenty-second embodiment of the present invention.

FIGS. 21 and 22 schematically illustrate, in section, the main electrodes and the surrounding portions in SI semiconductor devices according to 21st and 22rd embodiments of the present invention. The illustrated main electrode structures are both those of planar gate type SI semiconductor devices, which can each be formed either as a thyristor or transistor; these embodiments will be described as being applied to thyristors.

Figure 23:
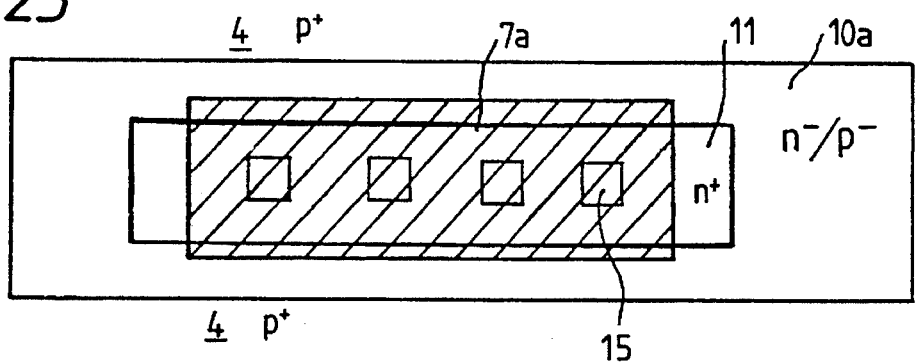
FIG. 23 is a schematic top plan view of a unit channel portion of the FIG. 22 embodiment.

In Embodiment 21 of FIG. 21 the $n^+$-type cathode region 11 is divided into two parallel stripe-like regions and the Schottky cathode shorted region 15 is formed between the $n^+$-type cathode regions 11. The cathode electrode 7a is formed in contact with the Schottky cathode shorted region 15 as well as the $n^+$-type cathode regions 11. That is, the cathode electrode 7a extends across an SI Schottky cathode shorted structure [$n^+$ (11)–$n^-$/$p^-$ (15)–$n^+$ (11)]. In this embodiment, holes distributed in the $n^-$/$p^-$-type region log are readily absorbed to the cathode electrode 7a through the Schottky cathode shorted region 15 sandwiched between the $n^+$-type cathode regions 11. On the other hand, in Embodiment 22 of FIG. 22, the $n^+$-type cathode region 11 is formed as a single stripe-shaped region and the cathode electrode 7a forms an ohmic contact with the $n^+$-type cathode region 11 and also forms a Schottky contact with the surrounding $n^-$/$p^-$-type region 10a, 15). In the $n^+$-type cathode region 11 there are formed SI Schottky cathode shorted regions 15 in the form of an island. FIG. 23 is a schematic top plan view of the unit channel portion of Embodiment 22 shown in FIG. 22. The cathode electrode 7a is formed in contact with the stripe-shaped $n^+$-type cathode region 11, the island-like Schottky cathode shorted regions 15 and the $n^-$/$p^-$-type region 10a.

Embodiments 23, 24 and 25

Figure 24:
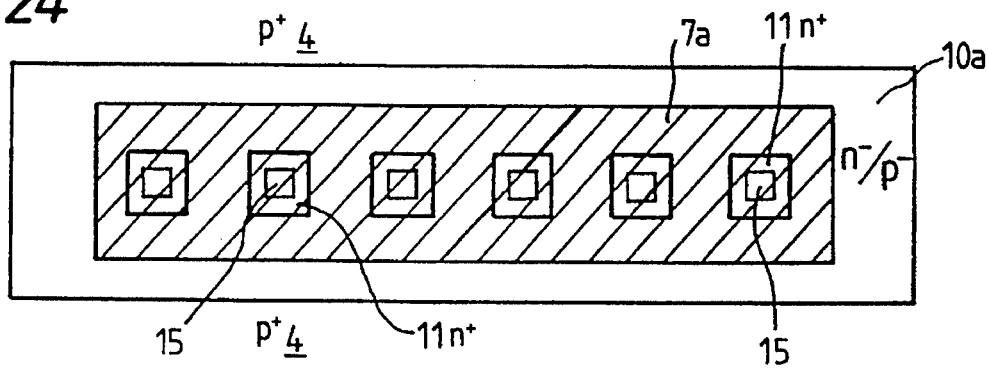
FIG. 24 is a schematic diagram showing an SI Schottky cathode shorted structure of the SI semiconductor device according to a twenty-third embodiment of the present invention.
Figure 25:
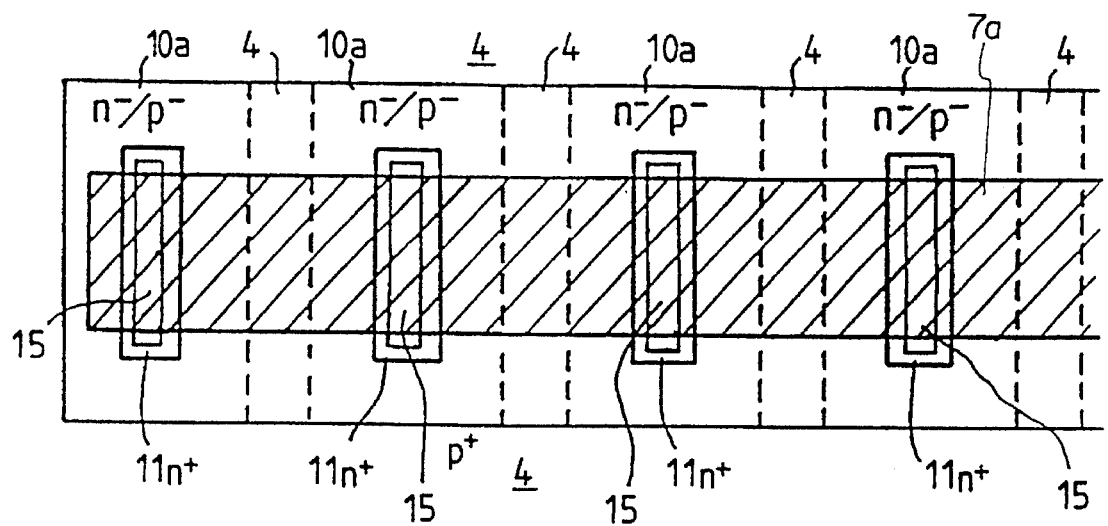
FIG. 25 is a schematic diagram showing an SI Schottky cathode shorted structure of the SI semiconductor device according to a twenty-fourth embodiment of the present invention.
Figure 26:
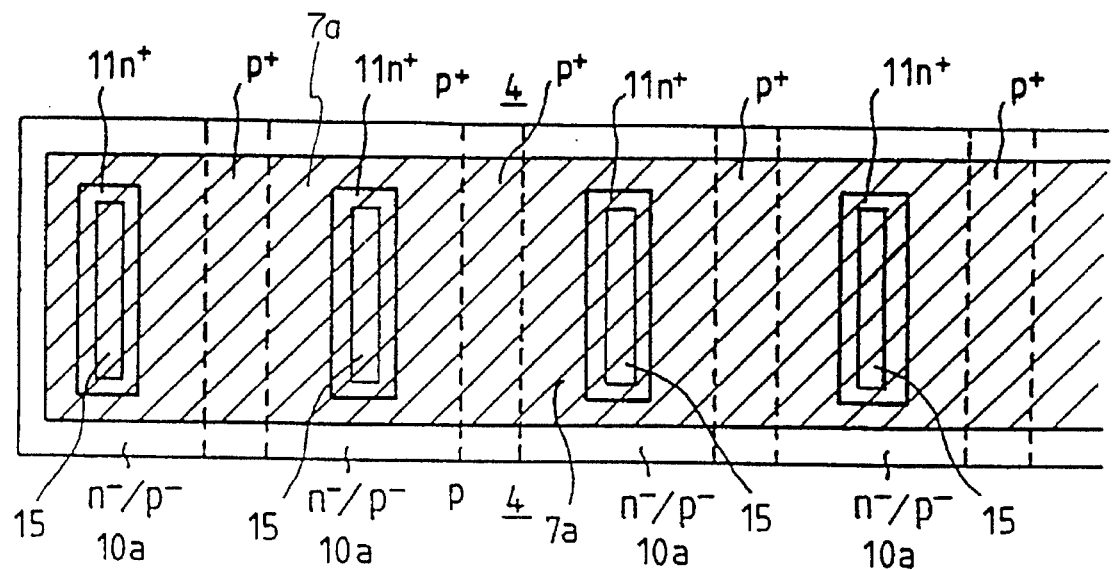
FIG. 26 is a schematic diagram showing an SI Schottky cathode shorted structure of the SI semiconductor device according to a twenty-fifth embodiment of the present invention.

Also in the case where the SI main electrode shorted structure according to the present invention is applied to a planar gate structure, various modifications can be effected by changing the layout patterns of the $n^+$-type cathode region 11 and the SI Schottky cathode shorted regions 15 each surrounded by the region 11. FIGS. 24 through 26 are top plan views illustrating modifications of the layout pattern the cathode region 11. FIG. 24 illustrates a 23rd embodiment of the present invention, in which subdivided $n^+$-type cathode regions 11 are arranged in the unit channel of the planar structure and SI Schottky cathode shorted regions 15 are each formed in one of the cathode regions 11. The cathode electrode 7a is formed over an [$n^+$ (11)–$n^-$/$p^-$ (10a)] cathode distributed structure and an [$n^+$ (11)–$n^-$/$p^-$ (15)–$n^+$ (11)] SI Schottky cathode shorted structure. FIG. 25 illustrates a 24th embodiment of the present invention, in which the cathode electrode 7a is formed in contact with the $n^+$-type cathode regions 11 formed in a plurality of channels and the SI Schottky cathode shorted regions 15 respectively formed in the cathode regions 11 and also in Schottky contact with the $n^-$/$p^-$-type regions surrounding the cathode regions 11. FIG. 26 illustrates a 25th embodiment of the present invention, in which the cathode electrode 7a is wider than in the FIG. 25 embodiment and entirely covers the $n^+$-type cathode regions 11 and the SI Schottky cathode shorted regions 15. This construction enhances the effect of absorbing holes distributed in the $n^-$/$p^-$-type regions 10a and permits control of the quantity of electron injection from the main electrode 7a through the Schottky junction by the Static Induction effect.

Now, a comparison will be made between the electrode structure of Embodiment 1 shown in FIG. 1 and the conventional structure shown in FIG. 39. Compared with the conventional uniform cathode electrode structure, the SI Schottky shorted structure according to the present invention shortens the turn-on time decreases the on-state voltage $V_T$, reduces the gate peak current value $I_{GP}$, increases the turn-off gain $G_{OFF}$, shortens the minority carrier storage time $t_s$ and the fall time $t_f$, and consequently shortens the turn-off time $t_{gq}$ ($=t_s+t_f$) and reduces the turn-off switching energy $E_{OFF}$ (mJ/pulse).

In particular, holes distributed between the gate region 4 and the cathode region 11 can efficiently be absorbed into the cathode electrode 7a by the electric field base on the diffusion potential between the SI Schottky cathode shorted region 15 and the n-type region 10, and hence the quantity Q of charges that are pulled out of the gate electrode is remarkably reduced—this lightens the burden on the gate driver, permitting its miniaturization.

The quantity of gate pull-out charges, Q (μC), in the FIG. 1 embodiment is about ⅓ or less than in the prior art structure.

Figure 39:
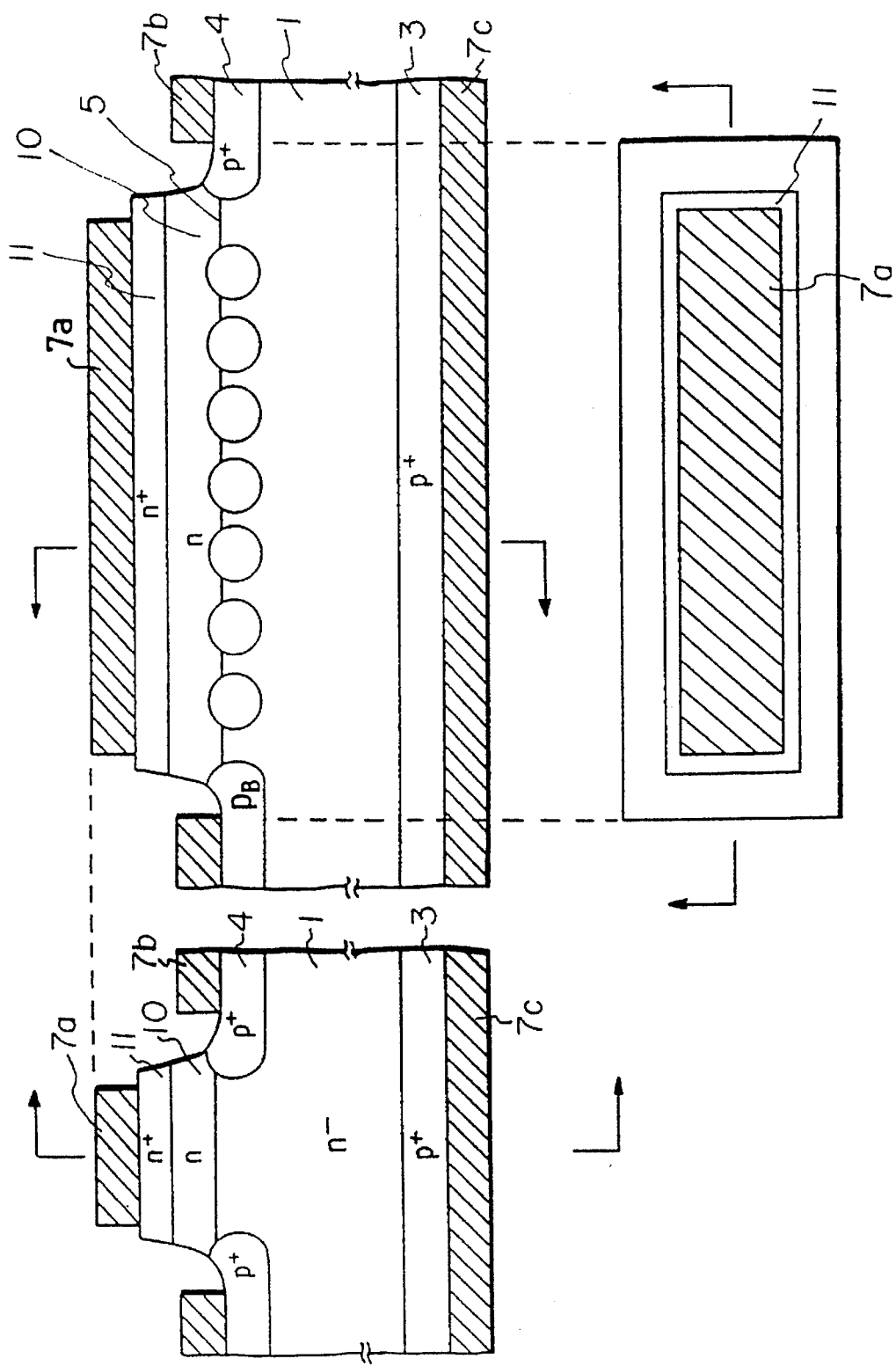
FIG. 39 schematically shows a sectional view and a top view of a conventional SI thyristor with a buried gate structure in which the cathode region is formed uniformly and homogeneously.
Figure 40:
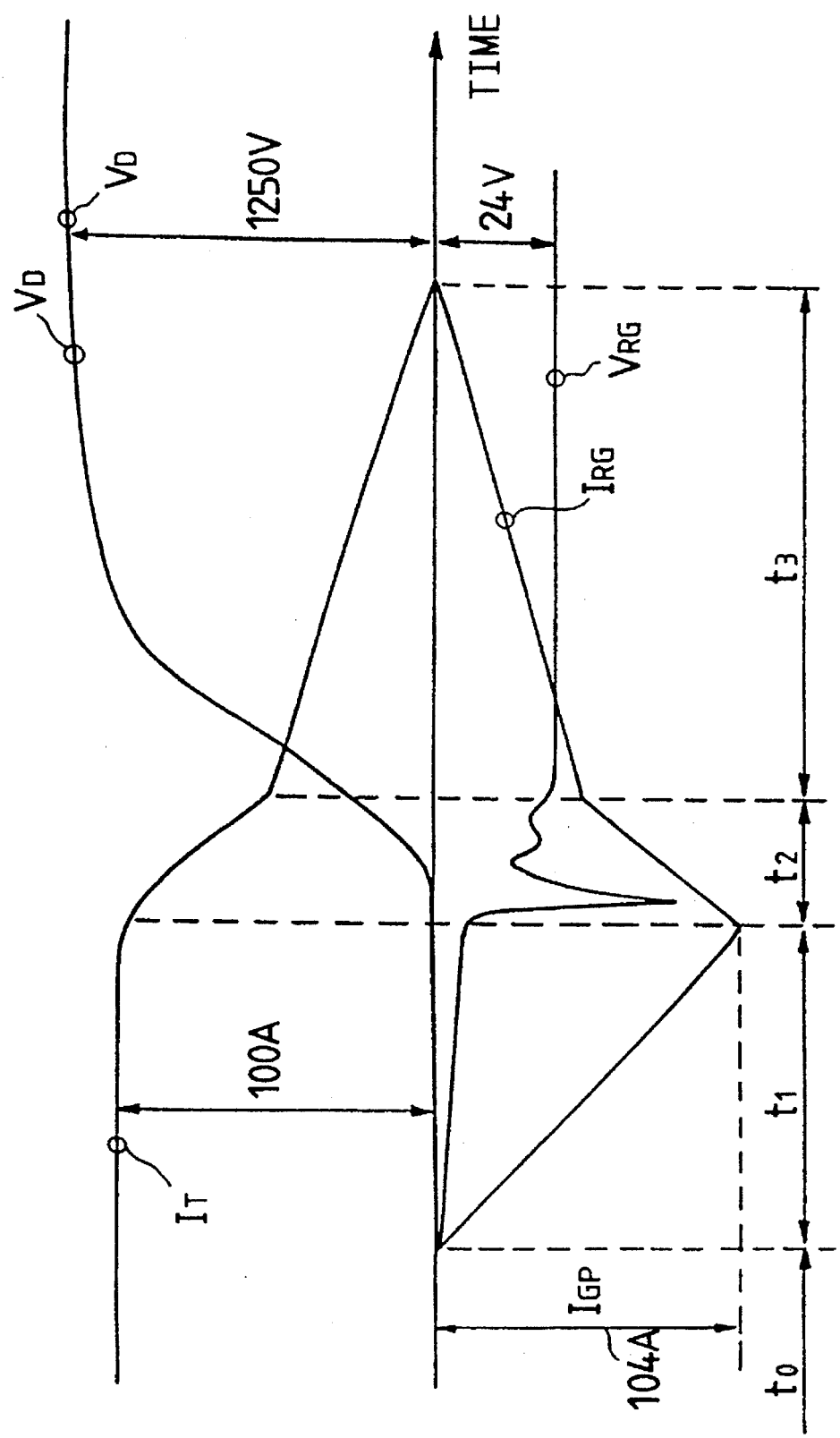
FIG. 40 schematically shows a typical switching waveform (under 1250V-100A switching conditions) in a conventional structure with no distributed cathode.

Compared with the SI thyristor of the FIG. 39 prior art structure irradiated with gamma rays for life time control, the SI thyristor with the SI Schottky cathode shorted structure of FIG. 1 possesses excellent turn-off switching capabilities such as high-speed operation, small quantity of gate pull-out charges and low loss.

Compared with the conventional device in terms of the forward current-voltage characteristic, the SI Schottky thyristor with the SI cathode shorted structure of the present invention has a forward voltage drop (i.e. the on-state voltage) $V_T$ large in the low current region but small in the high current region. Hence, the SI thyristor according to the present invention has high surge capability.

With respect to the relationship between the on-state voltage and the cathode electrode shorting ratio between the $n^+$-type cathode region and the SI Schottky cathode shorted region in the SI Schottky cathode shorted structure, the present invention suppresses an abrupt increase in the on-state voltage $V_T$ by holding the above-said shorting ratio below 30%.

The present invention is not limited specifically to Embodiments 1 through 25 described above but various modifications can be effected. For instance, a p-type region may be formed shallow in the interface between the $n^+$-type cathode region 11 and the cathode electrode 7a so as to absorb holes distributed in the $n^+$-type cathode region 11. This p-type region can be formed as shallow as tens of angstroms, for example, by sintering of an Al-Si alloy during the manufacture of the semiconductor device. This structure may be used in combination with the SI Schottky cathode shorted structure. It has been described previously that the n-type region 10 may be formed as a $p^-$- or p-type region, but in such an instance, it is preferable that the above-mentioned shallow p-type region be separated or isolated by the $n^+$-type cathode region 11 or a potential barrier from the n-type region (or $p^-$ or p-type region) 10.

The SI Schottky shorted structure according to the present invention is applicable not only to SI transistors and SI thyristors but also to devices which have other cathode or source structures, such as an IGBT and a MOS control thyristor.

It is a matter of course that the conductivity types of respective parts may be reversed in the embodiments described above.

The SI semiconductor device with the SI Schottky shorted structure according to the present invention possess such great advantages as listed below. These advantages are particularly remarkable in the case of thyristors using the structures according to the present invention.

(1) Since the barrier height at the Schottky junction can be controlled by the potential of the control region, it is possible to inject electrons from the main electrode through the Schottky junction, enabling the quantity of electron injection to be made larger than in the conventional distributed type structure. This improves the turn-on performance, shortens the turn-on delay time $t_d$ and the turn-on rise time $t_r$ and decreases the on-state voltage $V_T$. The electron injection through the Schottky junction can also be stopped by the gate potential with ease.

(2) The turn-off time (the sum of the minor carrier storage time $t_s$ and the fall time $t_f$) can be shortened and the turn-off switching energy loss $E_{OFF}$ can be reduced. The reduction of the minor carrier storage time $t_s$, in particular, allows fabrication of very easy-to-use devices such as a high-frequency PWM inverter and so on. Besides, since the minority carrier storage time $t_s$ can be reduced for each segment, variations in the device loss in each segment on the wafer is reduced—this allows ease in increasing the diameter of the wafer.

(3) Since the SI Schottky shorted structure markedly decreases the quantity of gate pull-out charges and increases the tun-off gain $G_{OFF}$, the gate driver can be simplified and miniaturized; thus, manufacturing costs of the semiconductor devices can be cut.

(4) The withstand voltage characteristic and the leak current under high temperature conditions are about the same as in conventional devices which do not utilize life time control, and the steady loss is low at the time of steady blocking. Hence, while the turn-off performance is enhanced, it is possible to keep excellent the on-state characteristic which usually has a trade-off relation to the turn-off performance. The decrease in the on-state voltage and the reduction of the turn-on time are particularly remarkable.

(5) Since the on-state voltage $V_T$ has a positive temperature characteristic, thermal runaway is not likely to occur during high-frequency operation, in particular; therefore, the devices of the present invention can be used at high frequencies.

(6) Even if the turn-off speed is raised extremely high, equal to that of the SI transistor, for example, substantially no influence is exerted on the firing characteristic. That is, substantially no changes are caused in the gate voltage and the gate current at the time of firing. Even if the turn-off performance is enhanced, the turn-off switching loss undergoes substantially no change in the low current region. In the high current region the turn-on rise time $t_r$ and the turn-on switching loss $E_{ON}$ tend to increase, and the delay time $t_d$ also becomes short. It is also possible to produce an effect of increasing the surge capability in the high current region.

Needless to say, SI transistors utilizing the structures according to the present invent ion could also benefit from the effects (1) through (6) referred to above with respect to thyristors.

It will be apparent that many modifications and variations may be effected without departing from the scope of the novel concepts of the present invention.

What is claimed is:

1. A static induction semiconductor device with a static induction Schottky shorted structure, which has a first main region formed in a first main surface of a high resistivity layer, a second main region formed in one of said first main surface and a second main surface of said high resistivity layer, and a control region formed near said first main region and in which said control region forms a potential barrier in a channel region in said high resistivity layer and said control region controls the height of said potential barrier in said channel region to control a main current between said first main region and said second main region, characterized in: said first main region has a structure wherein regions of higher and lower impurity densities relative to each other are distributed; a main electrode formed in contact with said first main region and making ohmic contact with said higher impurity density region to form an ohmic junction therebetween and making a Schottky contact with said lower impurity density region to form a Schottky junction therebetween; said lower impurity density region between said control region and said main electrode being essentially depleted; and a potential barrier height at said Schottky junction being controllable by static induction according to a potential of said control region.

2. The static induction semiconductor device of claim 1, characterized in that said regions of higher and lower impurity densities are a same conductivity type as each other but are opposite to a conductivity type of said control region.

3. The static induction semiconductor device of claim 1, characterized in that said lower impurity density region is opposite in conductivity type to said higher impurity density region but is of a same conductivity type as that of said control region.

4. The static induction semiconductor device of claim 1, wherein said main electrode in contact with said first main region is formed of one of aluminum (Al), molybdenum (Mo), tungsten (W), platinum (Pt), titanium (Ti), nickel (Ni) and their silicon (Si)-base alloys and silicides.

5. The static induction semiconductor device of claim 1, wherein said higher impurity density region is composed of a plurality of separate island regions distributed in said first main region.

6. The static induction semiconductor device of claim 1, characterized in that said control region has a buried structure.

7. The static induction semiconductor device of claim 1, characterized in that said control region has a recessed structure.

8. The static induction semiconductor device of claim 1, characterized in that said control region has a substantially planar structure.

9. The static induction semiconductor device of claim 1 is a static induction thyristor.

10. The static induction semiconductor device of claim 1 is a static induction transistor.

11. A static induction semiconductor device comprising:

a high resistivity layer;

a first main region formed in said high resistivity layer, said first main region including a high impurity density region and a low impurity density region, said high impurity density region having a higher impurity density than said low impurity density region;

a second main region formed in said high resistivity layer;

a control region formed in said high resistivity layer at a position closer to said first main region than said second main region, said control region including means for forming a channel region in said high resistivity layer and said control region controlling a height of a potential barrier in said channel region to control a main current between said first main region and said second main region;

a main electrode formed in contact with said first main region, said main electrode forming an ohmic contact with said high impurity density region and forming a Schottky junction with said low impurity density region, a potential barrier height of said Schottky junction being controllable by static induction of a potential of said control region, said low impurity density region between said control region and said main electrode being essentially depleted.

12. A device in accordance with claim 11, wherein:

a conductivity type of said low density region is similar to a conductivity type of said high density region;

said conductivity type of said high and low density regions are opposite to a conductivity type of said control region.

13. A device in accordance with claim 11, wherein:

a conductivity type of said low density region is opposite to a conductivity type of said high density region;

said conductivity type of said low density region is similar to a conductivity type of said control region.

14. A device in accordance with claim 11, wherein:

said high density region includes a plurality of separate island regions distributed in said first main region.

15. The static induction semiconductor device of claim 1, wherein:

said channel region is formed between two portions of said control region in said high resistivity layer.

16. The device of claim 11, wherein:

said channel region is formed between two portions of said control region in said high resistivity layer.

* * * * *